US009324891B2

(12) United States Patent
Shigeta et al.

(10) Patent No.: US 9,324,891 B2
(45) Date of Patent: Apr. 26, 2016

(54) SOLAR CELL, SOLAR CELL PANEL, AND DEVICE COMPRISING SOLAR CELL

(75) Inventors: Hiroaki Shigeta, Osaka (JP); Yuhji Yashiro, Osaka (JP); Yuhsuke Tsuda, Osaka (JP); Shintaro Miyanishi, Osaka (JP); Susumu Noda, Kyoto (JP); Masayuki Fujita, Kyoto (JP); Yoshinori Tanaka, Kyoto (JP)

(73) Assignees: Sharp Kabushiki Kaisha, Osaka (JP); Kyoto University, Kyoto (JP)

( * ) Notice: Subject to any disclaimer, the term of this patent is extended or adjusted under 35 U.S.C. 154(b) by 948 days.

(21) Appl. No.: 13/518,308

(22) PCT Filed: Dec. 22, 2010

(86) PCT No.: PCT/JP2010/073213
§ 371 (c)(1),
(2), (4) Date: Jul. 12, 2012

(87) PCT Pub. No.: WO2011/083693
PCT Pub. Date: Jul. 14, 2011

(65) Prior Publication Data
US 2012/0279553 A1 Nov. 8, 2012

(30) Foreign Application Priority Data

Jan. 7, 2010 (JP) ................................ 2010-002351
Aug. 24, 2010 (JP) ................................ 2010-187404

(51) Int. Cl.
*H01L 31/0232* (2014.01)
*H01L 31/0352* (2006.01)
(Continued)

(52) U.S. Cl.
CPC .... *H01L 31/035227* (2013.01); *H01L 31/0232* (2013.01); *H01L 31/02327* (2013.01); *H01L 31/0392* (2013.01); *H01L 31/03921* (2013.01);
(Continued)

(58) Field of Classification Search
None
See application file for complete search history.

(56) References Cited

U.S. PATENT DOCUMENTS 7,406,221 B2    7/2008   Noda et al.
7,853,111 B2   12/2010   Noda et al.
(Continued)

FOREIGN PATENT DOCUMENTS

JP    2006-24495 A    1/2006
JP    2006-32787 A    2/2006
(Continued)

OTHER PUBLICATIONS

Gomard et al., "Design and Fabrication of Photonic Crystal Thin Film Photovoltaic Cells", Photonics for Solar Energy Systems III, Proc. of SPIE, vol. 7725, 2010, 77250M-1-77250M-6.*
(Continued)

*Primary Examiner* — Benjamin Sandvik
(74) *Attorney, Agent, or Firm* — Morrison & Foerster LLP

(57) ABSTRACT

A solar cell (1) of the present invention includes a photoelectric conversion layer (2) and a photonic crystal provided inside the photoelectric conversion layer (2) in order to have a photonic band gap. The photonic crystal has defects (31) in order to provide a defect level in the photonic band gap. $Q_V$ which is a Q value representing a magnitude of a resonance effect yielded by coupling between the photonic crystal and an outside is substantially equal to $Q_\alpha$ which is a Q value representing a magnitude of a resonance effect yielded by a medium of the photoelectric conversion layer (2).

19 Claims, 25 Drawing Sheets

(51) Int. Cl.
*H01L 31/075* (2012.01)
*H01L 31/0392* (2006.01)

(52) U.S. Cl.
CPC ...... *H01L 31/035281* (2013.01); *H01L 31/075* (2013.01); *Y02E 10/548* (2013.01)

(56) References Cited

U.S. PATENT DOCUMENTS

| | | | |
|---|---|---|---|
| 7,998,877 B1* | 8/2011 | Chadda | 438/753 |
| 8,126,306 B2 | 2/2012 | Noda et al. | |
| 8,173,035 B2 | 5/2012 | Lin et al. | |
| 2007/0235072 A1 | 10/2007 | Bermel et al. | |
| 2008/0048102 A1* | 2/2008 | Kurtz et al. | 250/226 |
| 2008/0099793 A1* | 5/2008 | Fattal et al. | 257/233 |
| 2008/0259981 A1* | 10/2008 | Wang et al. | 372/44.01 |
| 2009/0008735 A1* | 1/2009 | Ogino et al. | 257/436 |
| 2010/0259826 A1* | 10/2010 | Ji et al. | 359/599 |

FOREIGN PATENT DOCUMENTS

| | | |
|---|---|---|
| JP | 2006-173329 | 6/2006 |
| JP | 2008-124230 A | 5/2008 |
| JP | 2009-533875 A | 9/2009 |
| WO | 2007/108212 A1 | 9/2007 |

OTHER PUBLICATIONS

Fujita, M. "Optical and Electrical Characteristics of Organic Light-Emitting Diodes with Two-Dimensional Photonic Crystals in Organic/Electrode Layers." *Japanese Journal of Applied Physics* vol. 44, No. 6A. 2005, pp. 3669-3677.

Non-Final Office Action received for U.S. Appl. No. 13/520,126, mailed on Apr. 21, 2014, 14 pages.

Requirement for Restriction received for U.S. Appl. No. 13/520,126, mailed on Oct. 21, 2013, 7 pages.

Biswas et al., "Enhancing Light-trapping and Efficiency of Solar Cells with Photonic Crystals", Materials Research Society Symposium Proceedings, vol. 989, 2007, 6 pages.

Curtin et al., "Fabrication of Photonic Crystal Based Back-Reflectors for Light Management and Enhanced Absorption in Amorphous Silicon Solar Cells", Materials Research Society Symp. Proc., vol. 1153, 2009, 6 pages.

Fujita et al., "Ultrasmall and Ultralow Threshold GaInAsP—InP Microdisk Injection Lasers: Design, Fabrication, Lasing Characteristics, and Spontaneous Emission Factor", IEEE Journal of Selected Topics in Quantum Electronics, vol. 5, No. 3, May/Jun. 1999, pp. 673-681.

International Search Report & Written Opinion received for PCT Patent Application No. PCT/JP2010/072807, mailed on Mar. 29, 2011, 13 pages (6 pages of English Translation and 7 pages of Official International Search Report & Written Opinion).

Non-Final Office Action for U.S. Appl. No. 13/520,495. Notification Date: Apr. 11, 2014; 10 pages.

Chutinan et al., "Light Trapping and Absorption Optimization in Certain Thin-Film Photonic Crystal Architectures", Physical Review A, vol. 78, 023825, 2008, pp. 023825-1-023825-15.

Daif et al., "Photonic Band-Engineering Absorption Enhancement of Amorphous Silicon for Solar Cells", Proc. of SPIE, vol. 7411, 2009, pp. 741100-1-741100-8.

Gomard et al., "Two-Dimensional Photonic Crystal for Absorption Enhancement in Hydrogenated Amorphous Silicon Thin Film Solar Cells", Journal of Applied Physics, vol. 108, 123102, 2010, pp. 123102-1-123102-8.

Manolatou et al., "Coupling of Modes Analysis of Resonant Channel Add-Drop Filters", IEEE Journal of Quantum Electronics, vol. 35, No. 9, Sep. 1999, pp. 1322-1331.

Postigo et al., "Enhancement of Solar Cell Efficiency using Two-Dimensional Photonic Crystals", Proc. of SPIE, vol. 7713, 2010, pp. 771307-1-771307-7.

Shigeta et al., Optimization of Photonic Crystal Effect for Enhancement of Optical Absorption in Photovoltaic Devices, 2010, pp. 04-054.

Tumbleston et al., "Absorption and Quasiguided Mode Analysis of Organic Solar Cells with Photonic Crystal Photoactive Layers", Optics Express, vol. 17, No. 9, Apr. 27, 2009, pp. 7670-7681.

Zhou et al., "Photonic Crystal Enhanced Light-Trapping in Thin Film Solar Cells", Journal of Applied Physics, vol. 103, 2008, pp. 093102-1-093102-5.

International Search Report and Written Opinion received for PCT Patent Application No. PCT/JP2010/073213, mailed on Apr. 5, 2011, 7 pages.

Final Office Action for U.S. Appl. No. 13/520,126. Notification date: Mar. 16, 2015. 19 pages.

Advisory Action for U.S. Appl. No. 13/520,126. Notification date: Jun. 12, 2015. 5 pages.

Japanese Office Action received for Japanese Patent Application No. 2014-187019, mailed on Jul. 7, 2015, 2 pages.

Non-Final Office Action for U.S. Appl. No. 13/520,126, mailed on Feb. 19, 2016; 14 pages.

* cited by examiner

ANGULAR ORIENTATION
IN WHICH LIGHT IS INCIDENT

F I G. 5
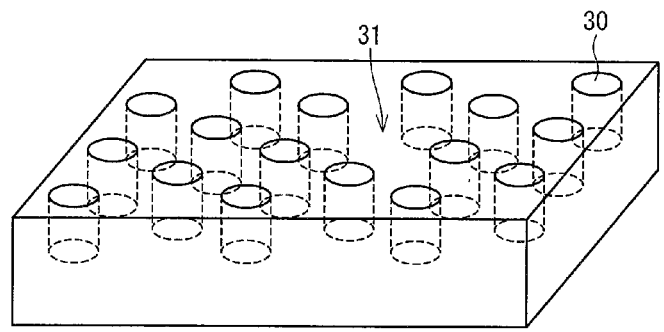
F I G. 6
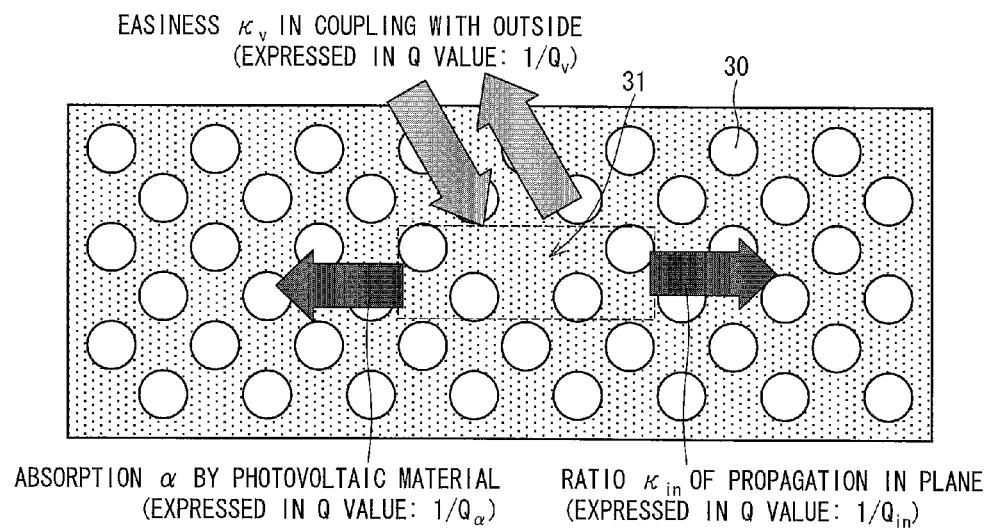

F I G. 9
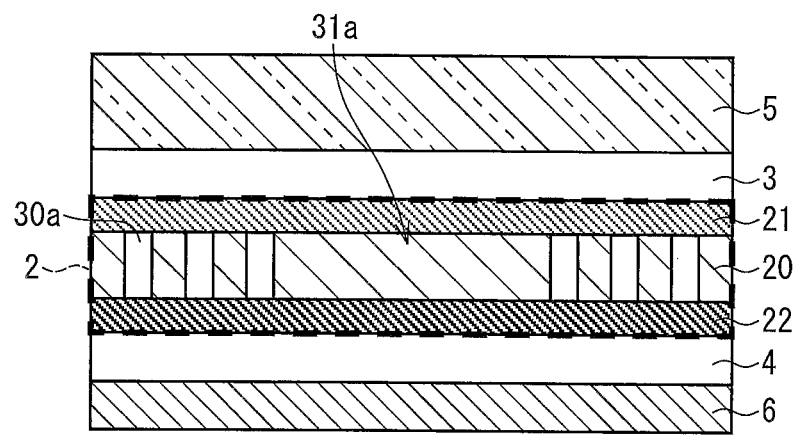

SOLAR CELL, SOLAR CELL PANEL, AND DEVICE COMPRISING SOLAR CELL

CROSS REFERENCE TO RELATED APPLICATIONS

This is a U.S. National Phase patent application of PCT/JP2010/073213, filed Dec. 22, 2010, which claims priority to Japanese Patent Applications No. 2010-002351, filed Jan. 7, 2010, and No. 2010-187404, filed Aug. 24, 2010, each of which is hereby incorporated by reference in the present disclosure in its entirety.

TECHNICAL FIELD

The present invention relates to a solar cell having a photonic crystal structure, a solar cell panel in which a plurality of the solar cells are arranged, and a device comprising the solar cell as a power source.

BACKGROUND ART

At present, for example, solar cells or optical sensors generally employ photoelectric conversion elements that convert incident light to an electric signal by photoelectric conversion. The photoelectric conversion element employs a semiconductor, and when electromagnetic waves (light) whose energy exceeds the band gap of the semiconductor are incident to the photoelectric conversion element, electrons are excited in the semiconductor from a valence band to a conduction band, so that photoelectric conversion occurs.

For example, it is generally known that a-Si which is an amorphous semiconductor has absorption at approximately 700 nm in wavelength (absorption edge of light is at approximately 700 nm). That is, electromagnetic waves (light) whose wavelength is shorter than the absorption edge are absorbed by a photovoltaic material, so that photoelectric conversion occurs in the photovoltaic material. However, an actual device exhibits absorption up to approximately 820 nm due to improvement in processing methods and manufacturing methods. Accordingly, generation of a photovoltaic power can be expected also in a band approximately between 700 nm and 820 nm in wavelength.

FIG. 32 is a view showing measured values of an absorption ratio of a-Si (of 330 nm in thickness) with respect to the wavelength of light.

As shown in FIG. 32, a-Si exhibits peaks of absorption at approximately 520 nm or less in wavelength, and as the wavelength becomes larger from approximately 520 nm to 820 nm at the absorption edge, a-Si exhibits a smaller absorption ratio. This is because the interaction between light and electrons is weak at a region between the absorption edge and the absorption peak of the semiconductor, and so electromagnetic waves (light) at the region are more likely to be transmitted by a-Si. Consequently, a photoelectric conversion ratio drops between the absorption edge and the absorption peak of the semiconductor. Therefore, in order that the semiconductor sufficiently absorbs light between the absorption edge and the absorption peak, it is necessary to make the semiconductor thicker.

Recently, in order to enhance a light absorption ratio, there have been developed photoelectric conversion elements using photonic crystals as disclosed in Patent Literatures 1-4 below.

FIG. 33 is a view schematically showing a configuration of a solar cell disclosed in Patent Literature 1.

Photonic crystals are periodic structures with different dielectric constants which are artificially formed in a dielectric material with periodicity substantially equal to the wavelength of light.

As shown in FIG. 33, a solar cell 101 is designed such that photovoltaic material 103 is laminated on a distributed Bragg reflector (DBR) 102 and a photonic crystal structure 104 having a plurality of air holes is formed in the photovoltaic material 103.

A part of incident light i having entered the photovoltaic material 103 is regularly reflected by the photonic crystal structure 104 to be reflective light r0, another part of the incident light i is diffracted by the photonic crystal structure 104 to be diffractive light r1, and still another part of the incident light i is refracted by the photonic crystal structure 104 to be refractive light t.

Since the diffractive light r1 results from diffraction with an angle θ' larger than the incident angle θ, the diffractive light r1 contributes to lengthening a light path inside the photovoltaic material 103. Furthermore, total internal reflection occurs at the interface between the photovoltaic material 103 and the outside air, so that the diffractive light r1 is resonated inside the photovoltaic material 103. Consequently, the photovoltaic material 103 exhibits an improved light absorption ratio.

Furthermore, the refractive light t and light reflected by the distributed Bragg reflector 102 to return to the photonic crystal structure 104 are reflected and go back and forth to cause resonance inside the photonic crystal structure 104 and absorbed therein gradually. This also improves the light absorption ratio.

As described above, in the solar cell 101, the incident light is resonated inside the photovoltaic material 103 and the photonic crystal structure 104 so that the light is absorbed, thereby improving the absorption ratio of the photovoltaic cell. In particular, by providing a resonance wavelength at a long wavelength side where the absorption ratio of incident light is small, it is possible to realize an absorbing body capable of absorbing sunlight with a wide wavelength range.

Furthermore, Non-patent Literature 2 below discloses a solar cell using photonic crystals with a band edge. The following explains a configuration of a solar cell disclosed in Non-patent Literature 2 with reference to FIG. 34.

A solar cell 200 shown in FIG. 34 is designed such that a photovoltaic layer 203 made of an organic material is provided with a photonic crystal and a band edge thereof is used so as to enhance absorption of the photovoltaic layer 203. As a result, by using the band edge of a band designed by means of the photonic crystal, absorption at a wavelength where absorption is small out of wavelengths of light absorbed by the photovoltaic layer 203 is enhanced, so that the whole photovoltaic amount is increased.

CITATION LIST

Patent Literatures

Patent Literature 1
  Japanese Translation of PCT International Application No. 2009-533875 (published on Sep. 17, 2009)
Patent Literature 2
  Japanese Patent Application Publication No. 2006-24495 (published on Jan. 26, 2006)
Patent Literature 3
  Japanese Patent Application Publication No. 2006-32787 (published on Feb. 2, 2006)
Patent Literature 4
  International Publication WO 2007/108212 (published on Sep. 27, 2007)

Non-Patent Literatures

Non-Patent Literature 1
C. Manolatou, M. J. Khan, Shanhui Fan, Pierre R. Villeneuve, H. A. Haus, Life Fellow, IEEE, and J. D. Joannopoulos "Coupling of Modes Analysis of Resonant Channel Add-Drop Filters"/IEEE JOURNAL OF QUANTUM ELECTRONICS/SEPTEMBER 1999 VOL. 35, NO. 9, PP. 1322-1331

Non-Patent Literature 2
J. R. Tumbleston, Doo-Hyun Ko, Edward T. Samulski, and Rene Lopez "Absorption and quasiguided mode analysis of organic solar cells with photonic crystal photoactive layers"/OPTICS EXPRESS/Optical Society of America/Apr. 27, 2009 Vol. 17, No. 9 PP. 7670-7681

SUMMARY OF INVENTION

Technical Problem

However, the solar cell 101 disclosed in Patent Literature 1 has a problem below. Since Patent Literature 1 does not describe details on the effect yielded by photonic crystals, it is unclear whether a Q value which is the result of resonance (alternatively, later-mentioned coefficients κ, α etc. indicative of easiness in coupling) becomes larger or smaller as the result of photonic crystal when conditions such as a thickness are changed.

That is, photonic crystals have an effect that (1) a larger Q value eliminates the interaction between light and a target device, so that light is less likely to be absorbed by the target device. Therefore, limitless increase in the Q value does not contribute to absorption of light.

Furthermore, the inventors of the present invention have discussed the mode coupling theory of photonic crystals described in Non-patent Literature 1, and newly found that (2) when easiness κv in coupling of the photonic crystal structure with an outside ($Q_V$ in the case of resonator) is substantially equal to easiness α in absorption which is an intrinsic characteristic of a photovoltaic device ($Q_\alpha$ in the case of resonator), the maximum absorption effect is yielded.

Accordingly, in consideration of the above (1) and (2), Patent Literature 1 has a problem that what condition for designing photonic crystals allows more efficient absorption is not disclosed clearly. That is, the disclosure of Patent Literature 1 does not enable a person skilled in the art to obtain findings for sufficiently exerting the effect of improving absorption yielded by photonic crystals.

Similarly, since Non-patent Literature 2 does not clearly describe what condition allows more efficient absorption, although it is possible to form a band edge designed by means of a photonic crystal, the wavelength band designed for contributing to absorption is narrow. Since the wavelength band at which light is absorbed is narrow, there is only small increase in the whole photovoltaic amount with respect to the wavelength (wavelength band) of the photovoltaic layer 203. Accordingly, the solar cell 200 disclosed in Non-patent Literature 2 has a practical problem as a photoelectric conversion device.

The present invention was made in view of the foregoing problems. An object of the present invention is to increase a light absorption ratio of a solar cell having a photonic crystal structure, and to increase the photovoltaic power of the solar cell.

Solution to Problem

In order to solve the foregoing problems, a solar cell in accordance with a first aspect of the present invention includes:
(1) a photoelectric conversion layer; and
(2) a photonic crystal inside the photoelectric conversion layer,
(3) a relation $0.26\, Q_V \leq Q_V \leq Q_\alpha \leq 0.96\, Q_V$ being met, wherein $Q_V$ is a Q value representing a magnitude of a resonance effect yielded by coupling between the photonic crystal and an outside and is proportional to an inverse number of a coefficient $\kappa_V$ indicative of strength of coupling between the photonic crystal and the outside, and $Q_\alpha$ is a Q value representing a magnitude of a resonance effect yielded by a medium of the photoelectric conversion layer and is proportional to an inverse number of a coefficient of absorption of light by the medium of the photoelectric conversion layer.

With the arrangement, the photonic crystal has a periodic structure made of the medium of the photoelectric conversion layer (first medium) and a second medium whose dielectric constant (refractive index) is different from that of the first medium, and light with a specific wavelength enters the photonic crystal and is resonated therein. The resonated light goes back and forth inside the medium of the photoelectric conversion layer and is absorbed by the medium of the photoelectric conversion layer, so that the light is converted photoelectrically.

Here, in a case where the coefficient $\kappa_V$ is substantially equal to the absorption coefficient, in other words, in a case where $Q_V$ is substantially equal to $Q_\alpha$, absorption of light by the medium of the photoelectric conversion layer is at maximum.

Even in a case where $Q_V$ is not substantially equal to $Q_\alpha$, when the relation $0.26\, Q_V \leq Q_\alpha \leq 0.96\, Q_V$ is met, the effect of light absorption by the photonic crystal is enhanced, and a short-circuit current ($J_{sc}$) of the solar cell can be improved without changing an open circuit voltage ($V_{co}$) and a fill factor (FF) of the solar cell. Consequently, it is possible to improve conversion efficiency of the solar cell.

Therefore, the above arrangement allows increasing the light absorption ratio of the photoelectric conversion element having a photonic crystal structure, and consequently allows increasing a photovoltaic power at the aforementioned band approximately between 520 nm to 820 nm in wavelength. Furthermore, by matching the wavelength of a resonance peak corresponding to the defect level with a wavelength band at which the ratio of absorption by the medium of the photoelectric conversion layer is low, the solar cell can absorb light at a wider wavelength band.

When it is possible to increase absorption of light by the solar cell (photovoltaic device) itself, it is possible to increase a ratio of a photovoltaic power to incident light (spectral sensitivity characteristic (or IPCE: Incident Photon-to-Current Efficiency)). This is because photons from the sun which could not be absorbed and converted photovoltaically in the conventional art can be converted into electrons in the present invention. Therefore, an effect of the present invention is such that the photonic crystal provided in the photovoltaic layer increases absorption of light, resulting in an increase in a short-circuit current (Jsc) of the solar cell. Here, assuming that Voc represents the open circuit voltage of the solar cell, FF represents the fill factor of the solar cell, and η represents conversion efficiency of the solar cell, the conversion efficiency can be expressed as follows.

$$\eta = Jsc \times Voc \times FF$$

Since the present invention allows increasing Jsc, the present invention can increase the conversion efficiency of the solar cell device, and accordingly can enhance usability of the solar cell device.

Solar cells in accordance with second to nineteenth aspects of the present invention will be described later.

A solar cell in accordance with a twentieth aspect of the present invention (1) includes: a photoelectric conversion layer in which a plurality of semiconductors are laminated; and a photonic crystal inside the photoelectric conversion layer, (2) at least one layer of the plurality of laminated semiconductors having protrusions, (3) the photonic crystal including the semiconductor having protrusions, (4) when a wavelength of resonance peak of the photonic crystal is $\lambda$, the protrusions being provided two-dimensionally and periodically with a pitch of not less than $\lambda/4$ and not more than $\lambda$, and (5) a relation $0.26\ Q_V \leq Q_V \leq Q_\alpha \leq 0.96\ Q_V$ being met, wherein $Q_V$ is a Q value representing a magnitude of a resonance effect yielded by coupling between the photonic crystal and an outside and is proportional to an inverse number of a coefficient $\kappa_V$ indicative of strength of coupling between the photonic crystal and the outside, and $Q_\alpha$ is a Q value representing a magnitude of a resonance effect yielded by a medium of the photoelectric conversion layer and is proportional to an inverse number of a coefficient $\alpha$ of absorption of light by the medium of the photoelectric conversion layer.

With the arrangement, by providing a plurality of protrusions on the semiconductor layer, it is possible to provide the photonic crystal. The photonic crystal thus provided is designed to have protrusions arranged two-dimensionally and periodically with a pitch of not less than $\lambda/4$ and not more than $\lambda$. Consequently, a band edge is provided at a point $\Gamma$ in a reciprocal lattice space of the photonic crystal, and the wavelength of light defined by the band edge is $\lambda$.

Accordingly, out of light incident to the photoelectric conversion layer in which the photonic crystal is provided, light incident in a vertical direction and with a wavelength of $\lambda$ can be confined and resonated in the photoelectric conversion layer. The light with a wavelength of $\lambda$ resonated in the photoelectric conversion layer is absorbed by the medium of the photoelectric conversion layer.

Here, in a case where the coefficient $\kappa_V$ is substantially equal to the absorption coefficient $\alpha$, in other words, in a case where $Q_V$ is substantially equal to $Q_\alpha$, absorption of light by the medium of the photoelectric conversion layer is at maximum and the wavelength band of the absorbed light is broadened at maximum.

Even in a case where $Q_V$ is not substantially equal to $Q_\alpha$, when the relation $0.26\ Q_V \leq Q_\alpha \leq 0.96\ Q_V$ is met, the effect of absorption of light by the photonic crystal is enhanced.

Therefore, the above arrangement allows increasing the light absorption ratio of the photoelectric conversion element having a photonic crystal structure, and consequently allows increasing a photovoltaic power at the band approximately between 520 nm and 820 nm in wavelength. Furthermore, by matching the wavelength of a resonance peak defined by the band edge with a wavelength band at which the ratio of absorption by the medium of the photoelectric conversion layer is low, the photoelectric conversion element can absorb light at a wider wavelength band.

A solar cell panel of the present invention includes a plurality of units provided one-dimensionally or two-dimensionally, each of the plurality of units being any one of the solar cells in accordance with the first to twentieth aspects of the present invention.

Since the solar cells with a high light absorption ratio are provided, the solar cell panel exhibits a high photoelectric conversion ratio.

In particular, since the solar cell in accordance with the third or twentieth aspect of the present invention does not have a defect in the photonic crystal, the solar cell can be manufactured more easily than a solar cell having a defect in photonic crystal. Therefore, the solar cell panel in which the solar cells in accordance with the third or twentieth aspect of the present invention are arranged has a merit that it is suitable for mass production.

A device including any one of the solar cells in accordance with the first to twentieth aspects of the present invention as a power source is also one category of the present invention. Examples of such a device include portable or stationary electronic apparatuses, home electric appliances, and advertising towers that operate using the solar cell as a power source.

Furthermore, a device including the aforementioned solar cell panel as a power source is also one category of the present invention. Examples of such a device include portable or stationary electronic apparatuses, home electric appliances, vehicles, and advertising towers that operate using the solar cell panel as a power source.

It should be noted that a combination of configurations recited in individual claims is not limited to a combination of one claim with a claim depending from the claim. Any combination of configurations is possible between one claim and another claim that is not dependent from the claim provided that the object of the present invention can be achieved by the combination.

Advantageous Effects of Invention

As described above, the solar cell of the present invention includes: a photoelectric conversion layer; and a photonic crystal 20 inside the photoelectric conversion layer, a relation $0.26\ Q_V \leq Q_\alpha \leq 0.96\ Q_V$ being met, wherein $Q_V$ is a Q value representing a magnitude of a resonance effect yielded by coupling between the photonic crystal and an outside and is proportional to an inverse number of a coefficient $\kappa_V$ indicative of strength of coupling between the photonic crystal and the outside, and $Q_\alpha$ is a Q value representing a magnitude of a resonance effect yielded by a medium of the photoelectric conversion layer and is proportional to an inverse number of a coefficient of absorption of light by the medium of the photoelectric conversion layer.

Since the light absorption effect by the photonic crystal is enhanced, the present invention yields an effect of increasing the light absorption ratio of a solar cell having a photonic crystal structure.

Furthermore, the solar cell of the present invention includes: a photoelectric conversion layer in which a plurality of semiconductors are laminated; and a photonic crystal inside the photoelectric conversion layer, at least one layer of the plurality of laminated semiconductors having protrusions, the photonic crystal including the semiconductor having protrusions, when a wavelength of resonance peak of the photonic crystal is $\lambda$, the protrusions being provided two-dimensionally and periodically with a pitch of not less than $\lambda/4$ and not more than $\lambda$, and a relation $0.26\ Q_V \leq Q_\alpha \leq 0.96\ Q_V$ being met, wherein $Q_V$ is a Q value representing a magnitude of a resonance effect yielded by coupling between the photonic crystal and an outside and is proportional to an inverse number of a coefficient $\kappa_V$ indicative of strength of coupling between the photonic crystal and the outside, and $Q_\alpha$ is a Q value representing a magnitude of a resonance effect yielded by a medium of the photoelectric conversion layer and is proportional to an inverse number of a coefficient $\alpha$ of absorption of light by the medium of the photoelectric conversion layer.

By providing a plurality of protrusions on the semiconductor layer, it is possible to provide the photonic crystal. Besides, since the light absorption effect by the photonic crystal is enhanced, the present invention yields an effect of increasing the light absorption ratio of a solar cell having a photonic crystal structure.

BRIEF DESCRIPTION OF DRAWINGS

FIG. 5 is a perspective view showing a photoelectric conversion layer in which a photonic crystal is provided.

FIG. 6 is a view explaining a relation between a magnitude of coupling of a photovoltaic device having a photonic crystal and a Q value.

FIG. 9 is a cross sectional view schematically showing another configuration example of a solar cell.

DESCRIPTION OF EMBODIMENTS

First Embodiment

The following explains an embodiment of the present invention with reference to FIGS. 1 to 11 and 21. It should be noted that sizes, materials, shapes, relative positions etc. of members described in the embodiment serve solely as examples and are not intended to limit the scope of the present invention, unless otherwise specified.

(Configuration Example 1 of Solar Cell)

Figure 1:
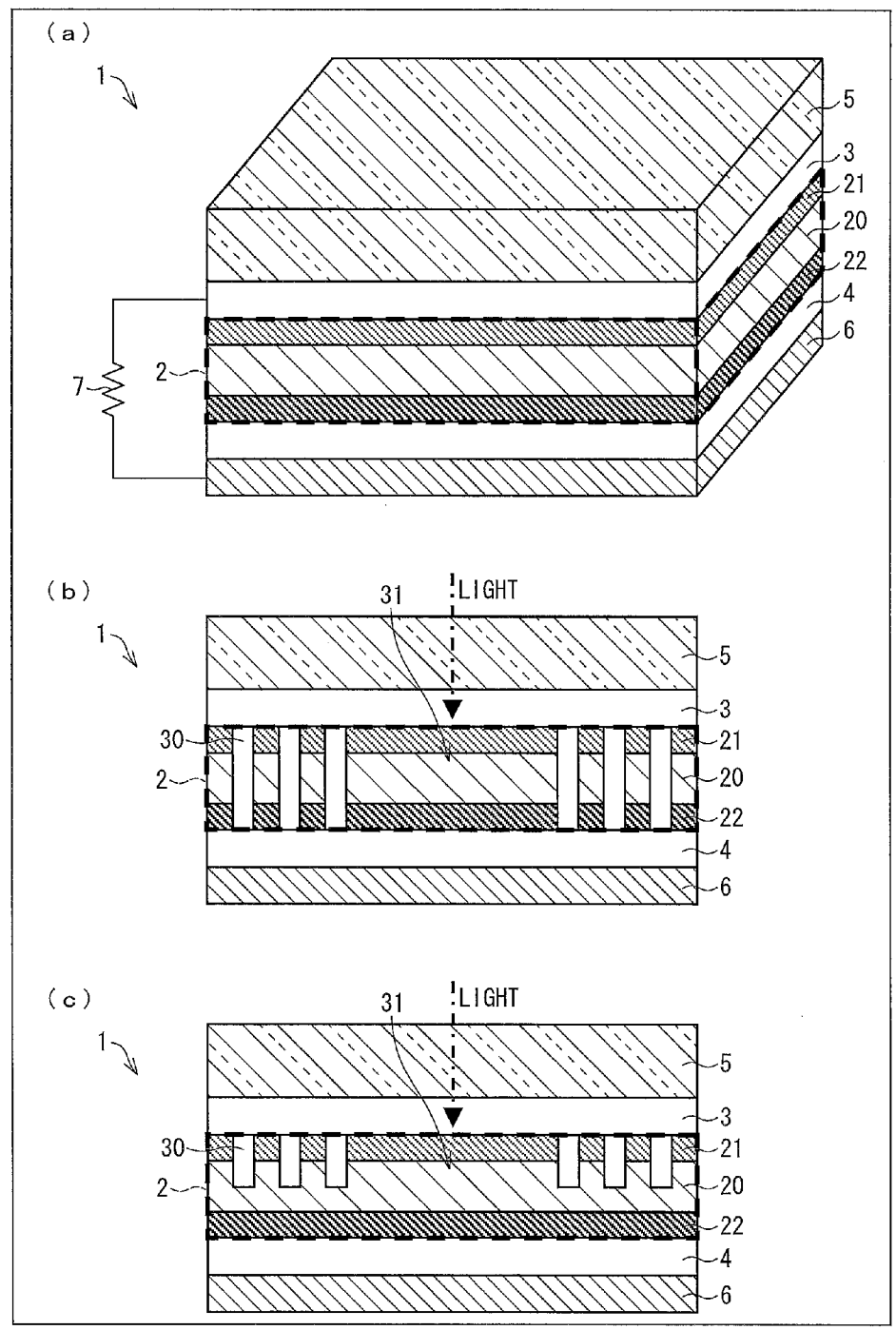
FIG. 1 is a view schematically showing a whole configuration of a solar cell in accordance with one embodiment of the present invention.

FIG. 1 is a view schematically showing a whole configuration of a solar cell 1 in accordance with the present embodiment. (a) of FIG. 1 shows a perspective view of the solar cell 1, and (b) and (c) of FIG. 1 show cross sectional views of the solar cell 1.

The solar cell 1 is an element for converting incident light to a current by photoelectric conversion. The solar cell 1 can be used also as a device for converting light into an electric signal, such as a light detection sensor.

The solar cell 1 includes a photoelectric conversion layer 2 in which a photonic crystal is provided, transparent conductive layers 3 and 4 which sandwich the photoelectric conversion layer 2 from the above and below, a glass substrate 5 for covering the transparent conductive layer 3 at a side where light is incident, and a metal electrode layer 6 for covering the transparent conductive layer 4 at a side opposite to the side where light is incident, i.e. at a back side. The metal electrode layer 6 is positioned at the outermost layer opposite to the side where light is incident to the solar cell 1. The transparent conductive layer 3 is one of two layers made of a medium whose refractive index is smaller than that of the medium of the photoelectric conversion layer 2, and the transparent conductive layer 4 is the other of the two layers.

The photoelectric conversion layer 2 has a structure in which semiconductor layers with different polarities are positioned adjacently to each other. In the present invention, the structure of the photoelectric conversion layer 2 is not particularly limited. For example, as shown in (b) and (c) of FIG. 1, the photoelectric conversion layer 2 may have a pin vertical structure in which an intrinsic semiconductor layer (i layer) 20 is sandwiched by a p-semiconductor layer 21 and an n-semiconductor layer 22.

To be more specific, the materials for the transparent conductive layers 3 and 4 may be ITO (Indium Tin Oxide), ZnO, $SnO_2$ etc. The glass substrate 5 may be glass whose refractive index is approximately 1.52 for example. Furthermore, the material for the metal electrode layer 6 may be one having a high light reflectance and a large electric conductivity, such as Ag and Al.

Light incident to the photoelectric conversion layer 2 via the glass substrate 5 generates, mainly at the intrinsic semiconductor layer 2, electrons and electron holes, and excites the electrons from a valence band to a conduction band, so that the light is absorbed by the intrinsic semiconductor layer 20. The excited electrons become a current that flows in a circuit including the transparent conductive layer 3, the metal electrode layer 6, and an external resistor 7, thereby generating a photovoltaic power at the external resistor 7.

The metal electrode layer 6 may also serve as a reflective plate. The metal electrode layer 6 can reflect light having been transmitted by the photoelectric conversion layer 2 without photoelectric conversion, so that the light travels to the photoelectric conversion layer 2 again. By providing the metal electrode layer 6 in such a manner as to cover the whole back surface of the solar cell 1, it is possible to surely reflect light having been transmitted by the photoelectric conversion layer 2, so that the solar cell 1 can have a high light absorption ratio.

As shown in the perspective view of FIG. 5, the photonic crystal provided in the photoelectric conversion layer 2 is a two-dimensional photonic crystal obtained by periodically arranging a plurality of nanorods (columnar mediums) 30 in the medium of the photoelectric conversion layer 2 having a thickness substantially corresponding to the wavelength of light. The nanorod 30 is made of a medium whose refractive index is smaller than that of the medium of the photoelectric conversion layer 2, and has a columnar shape for example. In a case where the medium of the photoelectric conversion layer 2 is, for example, amorphous silicon (a-Si) whose refractive index is approximately between 3 and 4, the medium of the nanorod 30 may be air or $SiO_2$ whose refractive index is 1.45. Besides, the material for the nanorod 30 may be JAS (transparent resin material) whose refractive index is approximately 1.6, or HSQ (Hydrogen Silsesquioxane) used as a SOG (Spin-on Glass) material. For example, FOX® (manufactured by Dow Corning Toray) etc. may be used as the HSQ.

Alternatively, the medium of the photoelectric conversion layer 2 may be microcrystalline silicon (μC—Si), Si, Ge, GaNINGaP, (In)GaAs, GaAs etc.

The distance for positioning the nanorods 30, i.e. the pitch (distance) p for the nanorods 30 is preferably shorter than the wavelength λ of light, and more preferably not less than λ/7 and not more than λ/2, in consideration of appropriately providing a later-mentioned photonic band gap. The wavelength λ is a wavelength of light which is confined and resonated inside the photonic crystal, to be more specific, a wavelength indicative of a resonance peak of the light.

The height of the nanorod 30 may be equal to the thickness of the photoelectric conversion layer 2 as shown in (b) of FIG. 1, or may be smaller than the thickness of the photoelectric conversion layer 2 as shown in (c) of FIG. 1. To be more specific, the height of the nanorod 30 is approximately not less than ¼ and not more than 1/1 of the thickness of the photoelectric conversion layer 2.

In the example shown in (b) of FIG. 1, the nanorod 30 penetrates the p-semiconductor layer 21, the intrinsic semiconductor layer 20, and the n-semiconductor layer 22 and thus has a height equal to the thickness of the photoelectric conversion layer 2. On the other hand, in the example shown in (c) of FIG. 1, the height of the nanorod 30 is such that the nanorod 30 penetrates the p-semiconductor layer 21 and reaches the middle of the thickness of the intrinsic semiconductor layer 20.

Furthermore, the radius of the nanorod 30 is preferably not less than 0.2a (0.4a in diameter) and not more than 0.4a (0.8a in diameter) based on a pitch a as a reference.

Figure 2:
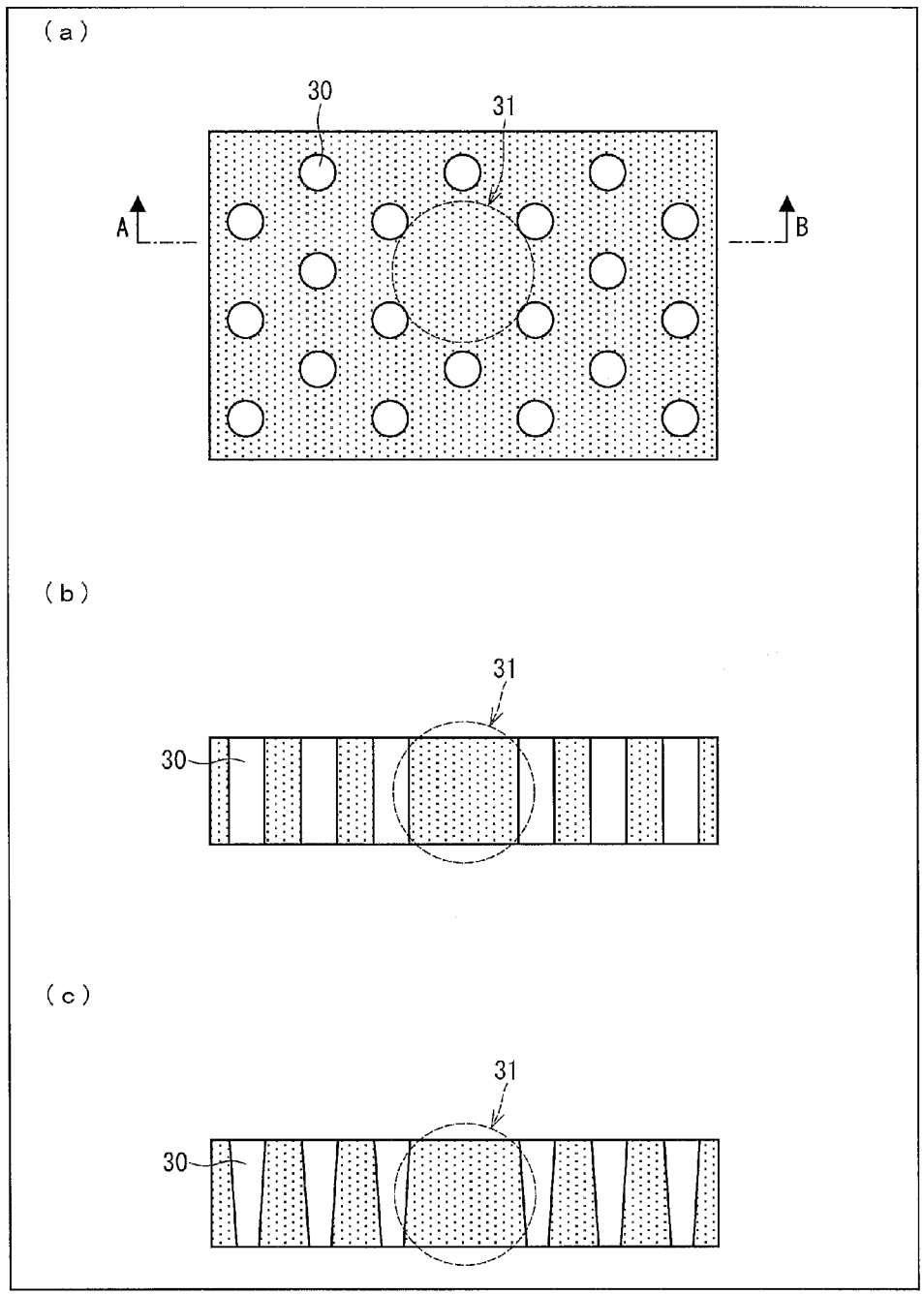
FIG. 2 is a view showing a configuration of a photonic crystal. (a) of FIG. 2 shows a top view, and (b) and (c) of FIG. 2 show cross sections taken along a line A-B of (a).

As shown in (b) and (c) of FIG. 2, the cross section of the nanorod 30 may be a column or a rectangular column whose top and bottom are identical, or may be a truncated pyramid or a truncated cone whose top and bottom are not identical.

(Photonic Band Structure)

Figure 3:
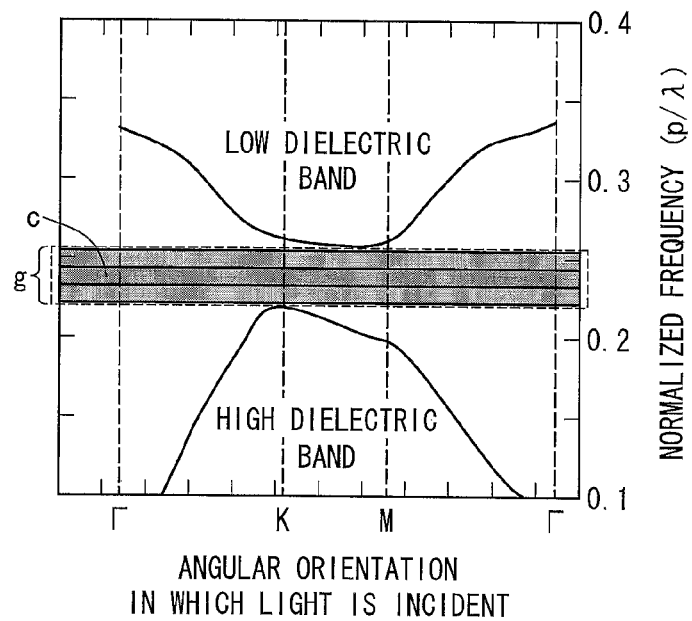
FIG. 3 is a graph showing a photonic band structure in terms of a relation between a direction in which light is incident to a photonic crystal and normalized frequency.

The photonic crystal configured as above has a photonic band structure as shown in FIG. 3. FIG. 3 is a graph showing a photonic band structure in terms of a relation between a direction in which light is incident to the photonic crystal and normalized frequency. The graph is obtained by connecting points plotted by using a relation between normalized frequencies and directions in which the light is incident. The normalized frequencies correspond to the wavelengths of light entering and resonated in the photonic crystal.

To be more specific, a low dielectric band resulting from the medium of the nanorod 30 and a high dielectric band resulting from the medium of the photoelectric conversion layer 2 are generated.

The photonic band structure has a photonic band gap g between the low dielectric band and the high dielectric band. The photonic band gap g is a wavelength band of light which cannot exist in the photonic crystal (band gap).

The normalized frequency is used as a parameter because the pitch a of the photonic crystal is related to the frequency of light, and is represented by a/λ. Accordingly, in FIG. 3, the wavelength is smaller as the scale mark of the graph is closer to the top of the longitudinal axis of the graph.

Figure 4:
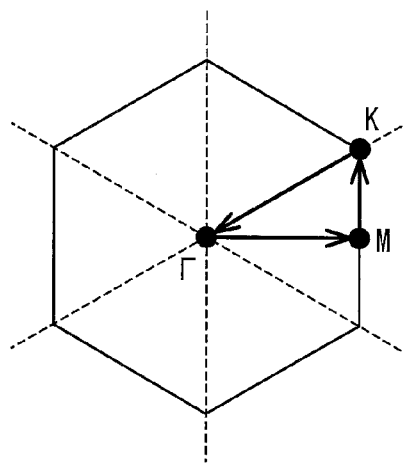
FIG. 4 is an explanatory view showing the position of a photonic crystal having triangular lattices in a reciprocal lattice space.

As shown in FIG. 4, the direction in which light is incident is indicated by a direction of a crystal which is represented by a reciprocal lattice space vector of a triangular lattice (two-dimensional plane portion of a hexagonal close-packed structure in crystal engineering). This is because a lattice arrangement sensed by light is an arrangement represented by a reciprocal lattice space (first Brillouin zone).

In FIG. 3, the point K indicates one corner of a hexagonal lattice surrounding the point Γ, and a point between the corner and adjacent corner is the point M. Γ indicates a direction in which light travels from directly above to the surface of the photonic crystal. K and M are used to indicate in-plane direction. In-plane directions are indicated by a combination of a starting point and an end point, such as ΓM, MK, and KΓ.

A triangle having Γ, K, and M at its corners is a unit lattice. A hexagon includes 12 unit lattices. When the direction of one unit lattice is determined, directions of the remaining unit lattices can be determined. For example, in a high dielectric band, the normalized frequency corresponding to M in FIG. 3 is approximately 0.2, which indicates that light that can be propagated in an in-plane direction of ΓM is only light with a wavelength corresponding to the normalized frequency of 0.2.

(Defect Level)

Next, as shown in (b) and (c) of FIG. 1, (a)-(c) of FIG. 2, and FIGS. 5 and 6, by forming a region where the nanorods 30 are not provided, i.e. defect 31 (also referred to as cavity or nanocavity) in the periodic structure of the nanorods 30, a defect level c is provided in the photonic band gap g. Light with a wavelength band (allowed band) corresponding to the defect level c is allowed to exist in the defect 31 whereas not allowed to exist in the photonic crystal surrounding the defect 31. As a result, the defect 31 and the nanorods 30 surrounding the defect 31 as a whole serve as a micro resonator in which light with a wavelength band corresponding to the defect level c is confined.

Figure 14:
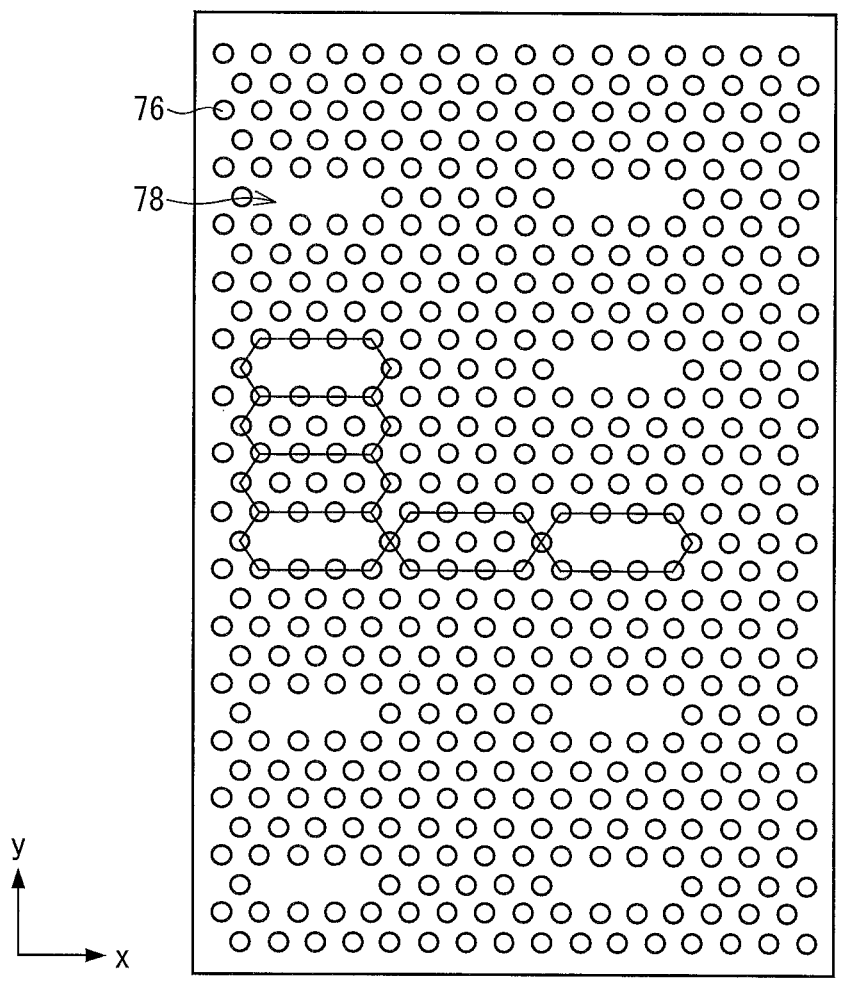
FIG. 14 is a plan view showing another two-dimensional arrangement (Example 2) of nanorods and defects in a photonic crystal provided in a semiconductor layer having the same laminate structure as that of Example 1.

The defect 31 may be provided by a one lattice point defect method to provide a region that lacks one nanorod 30 as shown in (a) of FIG. 2 or by a three lattice point linear defect method to provide a region that lacks three nanorods 30 in a linear manner as shown in FIG. 14 etc.

The photonic crystal made of the nanorods 30 and the defect 31 as above has no polarization characteristic etc. in a specific direction. For that purpose, the structure of the photonic crystal is symmetrical basically in every cross section. It is desirable that an electromagnetic field resulting from the structure is concentric.

(Design of Photonic Crystal Based on Q Value)

Here, the magnitude of coupling in light between the outside of the solar cell 1 and the photonic crystal is discussed in terms of a Q value. Similarly with a Q value regarding resonance in electric engineering, the Q value here represents the magnitude of a resonance effect of light as electromagnetic waves. The Q value may be represented in various ways, and may be represented by equation 1 or 2 below.

$$Q = \lambda p / \Delta \lambda \qquad \text{equation 1}$$

$$Q = \omega U / (-dU/dt) \qquad \text{equation 2}$$

Figure 8:
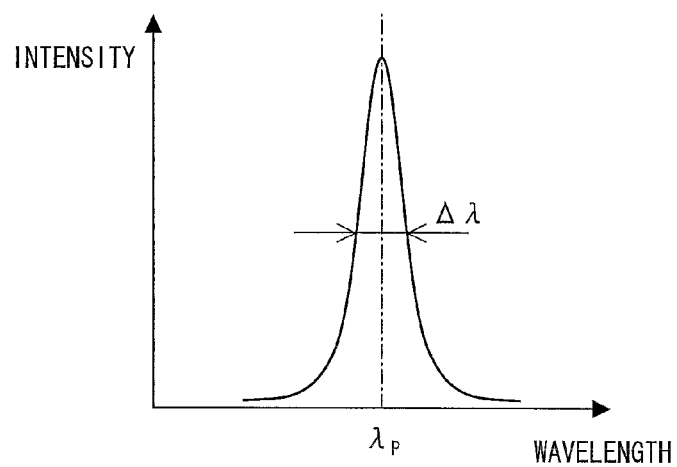
FIG. 8 is a graph showing a resonance peak of light in terms of a wavelength and strength.

FIG. 8 is a graph showing a resonance peak of light in terms of a relation between wavelength and intensity of light. As shown in FIG. 8, λp in the equation 1 indicates the wavelength of the resonance peak, and Δλ indicates a half bandwidth.

In the equation 2, ω indicates a resonant angular frequency, U indicates energy inside the resonator, and t indicates a time.

According to the equation 1, as the half bandwidth Δλ is smaller, resonance is stronger, indicating that as resonance is stronger, the Q value is larger. Furthermore, as resonance is stronger, the amplitude of the resonance is larger and waves are less likely to decay, indicating that as the Q value is larger, a time during which light exists in the resonator (life time) is longer.

Furthermore, according to the equation 2, as the loss of energy from the resonator is smaller, i.e. −dU/dt is smaller, the Q value is larger. Accordingly, the Q value may be regarded as indicating the strength with which the resonator confines light.

When forming a photonic crystal in a laser diode etc., the photonic crystal is designed such that the Q value is set as large as possible in order to make resonance stronger and increase light emission intensity. However, in the present invention, contrary to the above, a photonic crystal is designed such that the Q value is set to be as small as possible in order that the wavelength band of light confined in the resonator is broadened (i.e. half bandwidth is broadened) and the life time of the light is shortened, enabling more amount of light to be absorbed by a semiconductor layer. Broadening the half bandwidth of light makes it easier to make coupling in light between the outside and the photonic crystal, shortening the life time of light.

Figure 7:
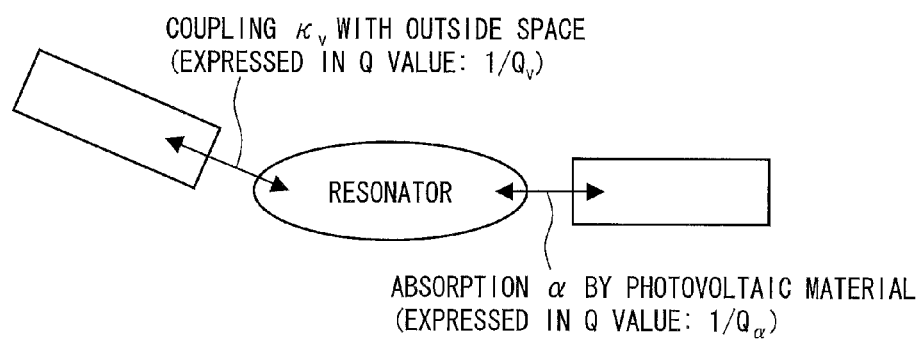
FIG. 7 is a view explaining a Q value of a resonator made of a defect in a photonic crystal.

Here, the defect 31 shown in FIG. 6 is regarded as the resonator shown in FIG. 7 and the Q value is discussed in terms of the whole system including the outer space and the medium of the base material of the photonic crystal (i.e. semiconductor constituting the photoelectric conversion layer 2). Assuming that the Q value of the solar cell 1 as a whole is $Q_T$, the Q value regarding coupling between the photonic crystal and the outer space is $Q_V$, the Q value regarding propagation in an in-plane direction of the photonic crystal is $Q_{in}$, the Q value regarding absorption of light by the medium is $Q_\alpha$, and the Q value regarding absorption of light by the metal electrode layer 6 is $Q_M$, a relational expression (equation 3) below is met.

It should be noted that, as shown in equation 4 below, Qα mentioned above is proportional to an inverse number of a light absorption coefficient α of the base material of the photonic crystal.

$$1/Q_T = 1/Q_V + 1/Q_{in} + 1/Q_\alpha + 1/Q_M \qquad \text{equation 3}$$

$Q_V$ is proportional to an inverse number of a coefficient κV indicative of strength of coupling (easiness in coupling) between the photonic crystal and the outer space, and represents easiness in light emission to the outer space due to coupling between the photonic crystal and the outer space. When the structure of the photonic crystal is determined, it is possible to calculate $Q_V$ by FDTD (Finite Difference Time Domain). That is, $Q_V$ is a Q value determined by the structure of the photonic crystal.

$Q_{in}$ indicates easiness in horizontal propagation of light having entered the photonic crystal. Accordingly, in terms of confinement of light, $Q_{in}$ indicates easiness in leakage of light from the resonator without being confined. $Q_\alpha$ and $Q_M$ indicate the magnitudes of resonance effects yielded respectively by the medium and the metal constituting the metal electrode layer 6 absorbing light. $Q_M$ can be obtained by measurement.

On the other hand, $Q_\alpha$ has a relation represented by equation 4 below with the absorption coefficient α unique to the medium, a refractive index n of the medium, and a wavelength λ of a resonance peak. That is, Qα is a Q value determined by the material of the medium.

$$\alpha = 2\pi n / \lambda Q_\alpha \qquad \text{equation 4}$$

When $Q_V=Q_\alpha$ in the relational expression of the equation 3, in other words, when $\kappa_V=\alpha$, absorption of light by the medium is at maximum, and the wavelength band of the absorbed light is broadened at maximum.

Furthermore, when the resonance effect in the resonator is ideal and light does not leak into the plane of the optical semiconductor device, $Q_{in}=\infty$.

Consequently, equation (5) below is obtained.

$$Q_T = \pi \cdot n \cdot Q_M / (\lambda \cdot \alpha \cdot Q_M + \pi \cdot n) \quad \text{equation 5}$$

Here, the Q value ($Q_T$) of the solar cell 1 as a whole in which the photonic crystal is designed to meet a relation $Q_V=Q_\alpha$ is calculated specifically by the equation 5. Initially, assuming the medium to be a-Si, the refractive index n is 4.154 and the absorption coefficient α is 65534 $cm^{-1}$. Furthermore, assuming the wavelength λ to be 660 nm and $Q_M$ of the metal to be 4000, $Q_T$ has a very small value below.

$$Q_T=11.1$$

From the equation 1, Δλ=59.5 nm is obtained, which is a very wide half bandwidth. It is preferable that $Q_T>10$, and Δλ is several ten nm.

Accordingly, by designing the photonic crystal to meet the relation $Q_V=Q_\alpha$ (designing the radius of the nanorod 30, the pitch a for the nanorod 30 etc.), it is possible to make light confined in the defect 31 more easily absorbed by the medium, and to obtain a resonance effect in a wider wavelength range. In other words, the solar cell of the present invention is a solar cell in which a photoelectric conversion layer includes a photonic crystal designed such that the Q value determined by the structure of the photonic crystal is equal to the Q value determined by the material of the medium of the photoelectric conversion layer including the photonic crystal.

An additional explanation is made here as to a relation between the coefficient $\kappa_V$ and the absorption coefficient α. Initially, since the photovoltaic material originally has a relatively high light absorption ratio, a tends to be large and Qα tends to be small in reverse.

On the other hand, in a case where a photonic crystal is provided in the photovoltaic material, since refractive index of the photovoltaic material is generally higher by 1 or more than that of nanorods, providing the photonic crystal without any modification tends to make the coefficient $\kappa_V$ smaller and reversely make $Q_V$ larger. Therefore, by nature, a relation $\kappa_V \leq \alpha (Q_V \leq Q_\alpha)$ is met.

For the purpose of increase in light absorption by the photovoltaic device, which is a goal to be achieved by the present invention, it is necessary that light coupled to the resonator made of the defect in the photonic crystal is subjected to an absorption process by the photovoltaic device. This effect is maximized when $\kappa_V = \alpha(Q_V=Q_\alpha)$.

In view of the above, in order to increase light absorption by the photovoltaic device, it is necessary to meet the relation $\kappa_V=\alpha(Q_V=Q_\alpha)$, which requires making $\kappa_V$ larger (making $Q_V$ smaller). In order to make $\kappa_V$ larger (make $Q_V$ smaller), it is necessary to increase the ratio of coupling of the resonator as a whole constituted by the photonic crystal (device as a whole) (decrease the Q value of the photovoltaic device, i.e. $Q_T$ mentioned above).

A more detailed discussion can be made in consideration of the aforementioned mode coupling theory. Specifically, when the thickness of a transparent layer corresponding to the transparent conductive layer 4 in the solar cell 1 meets a relation θ=2mπ (m=0, 1, 2 . . . ), $P_V$ indicative of the ratio of optical energy absorbed by the optical semiconductor layer is represented by an equation below.

$$P_V = (8 \cdot Q_\alpha/Q_V)/(1+2Q_\alpha/Q_M+2Q_\alpha/Q_V)^2$$

It can be concluded from this relational expression that in order to use 90% or more of light, it is desirable to design a photonic crystal structure to meet a relation $0.26 Q_V \leq Q_\alpha \leq 0.96 Q_V$.

(Configuration Example 2 of Solar Cell)

FIG. 9 is a cross sectional view schematically showing another configuration example of the solar cell 1. A difference between the present configuration example and the configuration of the solar cell 1 described with reference to FIG. 1 lies in that a photonic crystal is provided inside the intrinsic semiconductor layer 20 in the present configuration example.

As shown in FIG. 9, a plurality of nanorods 30a are arranged two-dimensionally and periodically in the intrinsic semiconductor layer 20, and there is provided a defect 31a where the nanorods 30a are not provided partially.

As already described, light incident to the photoelectric conversion layer 2 generates, mainly at the intrinsic semiconductor layer 2, electrons and electron holes, and excites the electrons from a valence band to a conduction band, so that the light is absorbed by the intrinsic semiconductor layer 20. Accordingly, by providing a photonic crystal at least in the intrinsic semiconductor layer 20, it is possible to enhance efficiency in photoelectric conversion.

Example 1

The following explains an example of the solar cell with reference to FIGS. 10 to 13.

Figure 10:
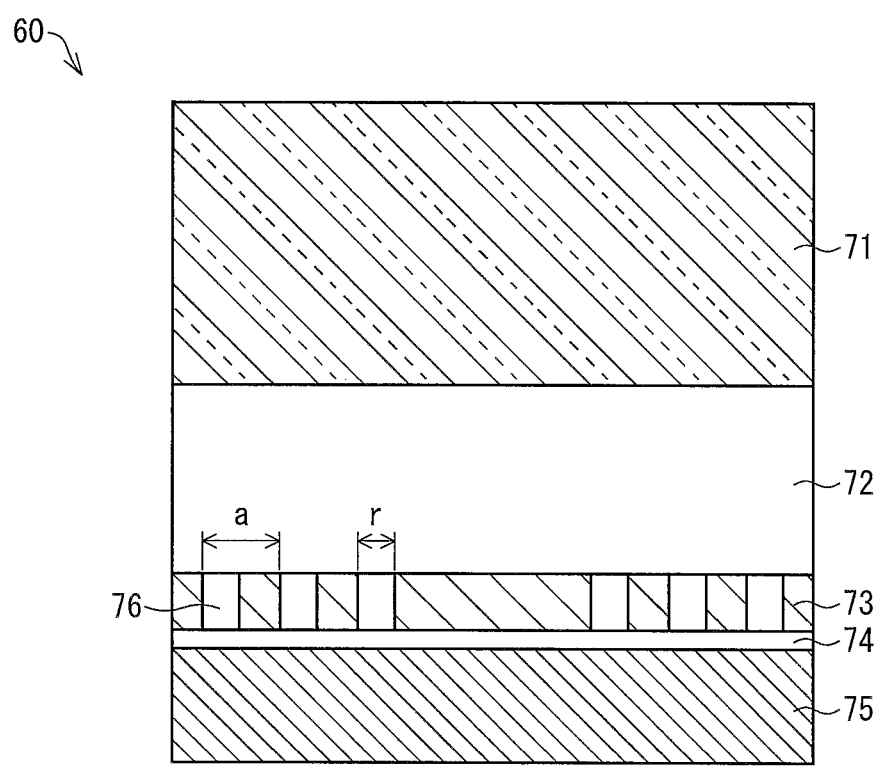
FIG. 10 is a cross sectional view showing a laminate structure of a solar cell as Example 1.
Figure 11:
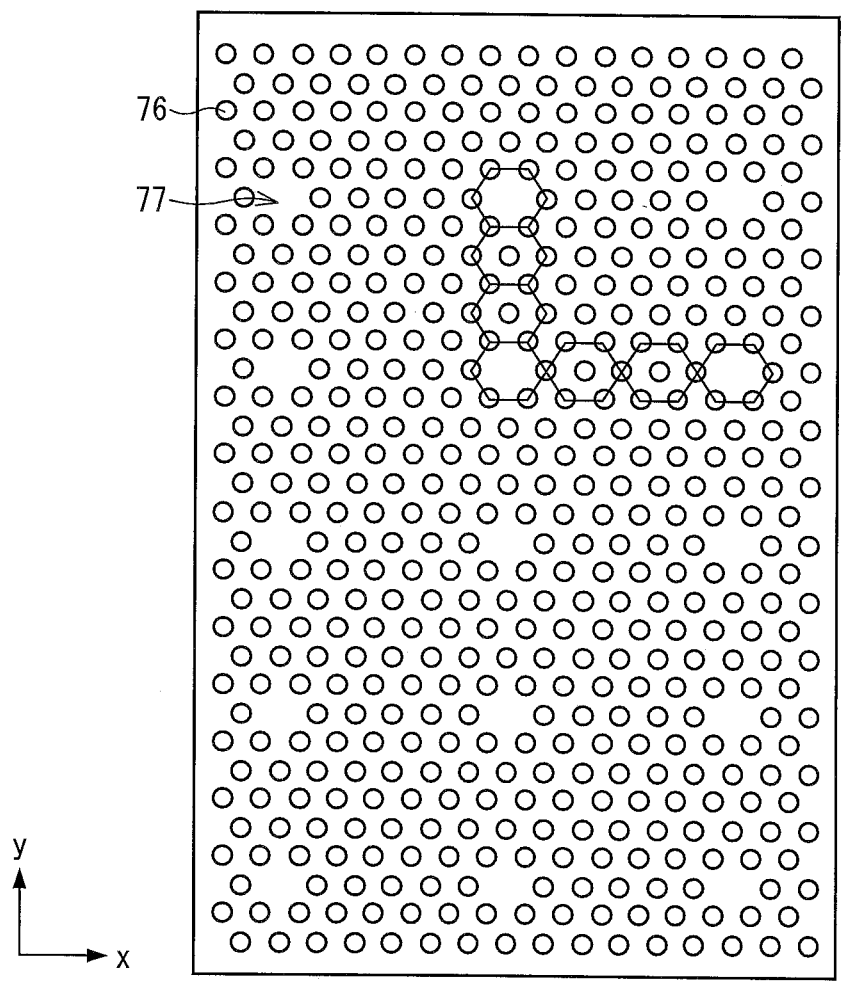
FIG. 11 is a plan view showing a two-dimensional arrangement of nanorods and defects (cavities) in a photonic crystal provided in a solar cell.

FIG. 10 is a cross sectional view showing a laminate structure of a solar cell 60 as Example 1. FIG. 11 is a plan view showing a two-dimensional arrangement of nanorods and defects (nanocavities) in a photonic crystal provided in the solar cell 60.

The solar cell 60 includes a glass substrate 71, a transparent conductive layer 72 made of ZnO, a semiconductor layer 73 having a pin connection structure of a-Si, a transparent conductive layer 74 made of ZnO, and a metal electrode layer 75 made of Al which are laminated in this order from a light-receiving surface of the solar cell 60. The transparent conductive layers 72 and 74 may be made of $SnO_2$.

Refractive indices of the glass substrate 71, the transparent conductive layer 72, the semiconductor layer 73, and the transparent conductive layer 74 are 1.52, 2.0, 3.76, and 2.0, respectively. The semiconductor layer 73 having high refractive index in which the photonic crystal is provided is sandwiched by the transparent conductive layers 72 and 74 having low refractive indices.

Furthermore, the thicknesses of the transparent conductive layer 72, the semiconductor layer 73, the transparent conductive layer 74, and the metal electrode layer 75 are 900 nm, 330 nm, 60 nm, and 100 nm, respectively.

The transparent conductive layer 72, the semiconductor layer 73, the transparent conductive layer 74, and the metal electrode layer 75 are sequentially evaporated and formed on the glass substrate 71 in such a manner as to have the above thicknesses, respectively.

As described with reference to FIG. 1 etc., in the semiconductor layer 73, columnar nanorods 76 whose diameter r is 60 nm are arranged two-dimensionally with a pitch of 200 nm. The nanorods 76 are made of $SiO_2$ whose refractive index is 1.45.

As shown in FIG. 11, assuming that the nanorods 76 are positioned at corners and a center of each of a plurality of hexagons consisting of triangular lattices on a plan view and the plurality of hexagons are referred to as first units (indicated by thin lines in FIG. 11), since the pitch for the nanorods 76 is a, the first units are arranged two-dimensionally with a pitch of 2a in an x-direction and √3a in a y-direction perpendicular to the x-direction, and defects 77 where the nanorods 76 are not provided are arranged in a square lattice manner with a pitch of 4a to 8a in an x-direction and 2√3a to 4√3a in a y-direction.

The pitches for positioning the first units and the defects 77 are further described below. For example, assuming that a distance between the centers of the hexagons constituting the first units which are adjacent to each other in the x-direction is Lx and a distance between the centers of the hexagons constituting the first units which are adjacent to each other in the y-direction is Ly, the first units are arranged two-dimensionally with a pitch of Lx=2a in the x-direction and Ly=2√3a in the y-direction. Therefore, the defects are arranged with a pitch of 2Lx to 4Lx in the x-direction and also 2Ly to 4Ly in the y-direction.

The arrangement in a square lattice manner mentioned above indicates an arrangement with the same pitch both in the x-direction and the y-direction. For example, when the defects 77 are arranged with a pitch of 2Lx in the x-direction and also 2Ly in the y-direction, the defects 77 are arranged in a square lattice manner.

The result of simulation by the FDTD method confirmed that when the defects 77 are arranged in a square lattice manner, resonances respectively generated in the defects 77 arranged on the whole light-receiving surface of the semiconductor layer 73 interact with each other.

As the area where resonances interact with each other is larger, the Q value ($Q_T$) of the photoelectric conversion element 60 as a whole is smaller. Furthermore, as the height of the nanorod 76 is smaller with respect to the thickness of the semiconductor layer 73, the Q value ($Q_T$) is smaller, and consequently the coefficient $\kappa_V$ indicative of coupling with the outside is larger. Based on the above discussion, it is possible to increase the amount of light that can be absorbed by the photovoltaic layer (semiconductor layer 73).

Figure 12:
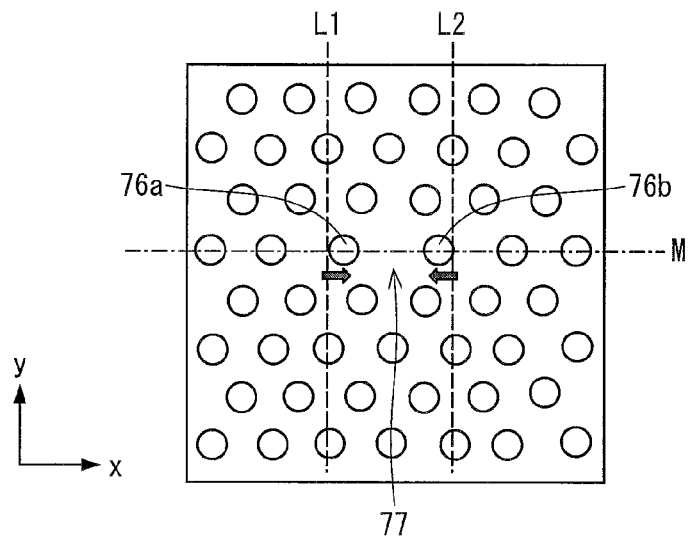
FIG. 12 is an explanatory plan view showing an intentional disarrangement in a periodic structure of nanorods surrounding a defect in a photonic crystal.

Furthermore, as shown in FIG. 12, there was carried out a simulation in which among the nanorods 76 surrounding the defect 77, two nanorods 76a and 76b positioned on a line M extending in a specific direction (x-direction) were shifted oppositely to each other from the corners of the hexagon (indicated by lines L1 and L2) in the specific direction so that a distance between the two nanorods 76a and 76b were shorter.

Figure 13:
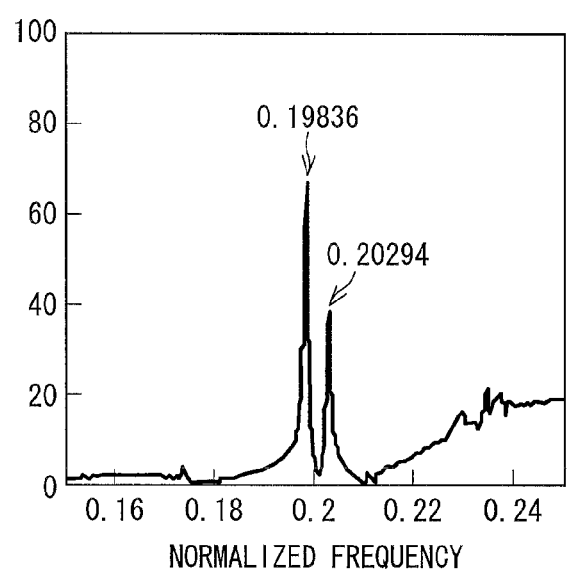
FIG. 13 is a graph showing, in terms of a relation between normalized frequency and light intensity, a resonance occurring at a defect in a photonic crystal provided in the solar cell of Example 1.

The result of the simulation by the FDTD method showed that disarranging the periodic structure of the nanorods 76 surrounding the defect 77 allows splitting degeneracy of a resonance peak of light confined and resonated inside the defect 77. The result of the simulation is shown in FIG. 13. FIG. 13 is a graph showing, in terms of a relation between normalized frequency and light intensity, a resonance effect yielded by the defect 77 of the photonic crystal provided in the photoelectric conversion element 60 of the Example 1. As shown in FIG. 13, there are two resonant points for one defect (cavity of 1 dot).

Figure 18:
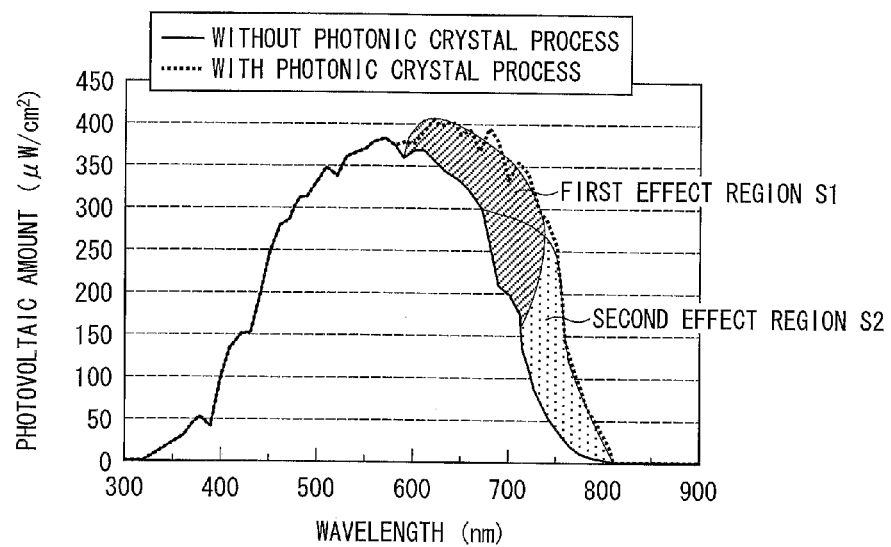
FIG. 18 is a graph showing a characteristic curve of a photovoltaic amount with respect to a wavelength of light in a solar cell.

FIG. 18 is a graph showing a characteristic curve of a photovoltaic amount ($\mu W/cm^2$) with respect to a wavelength (nm) of light. As shown in FIG. 18, in a case where a photonic crystal is not provided in the semiconductor layer 73, the photovoltaic amount has a peak at approximately 550 nm in wavelength with substantially a symmetrical decrease therefrom to 0.

On the other hand, in a case where the photonic crystal having the above structure is provided in the semiconductor layer 73, there appear a first effect region S1 and a second effect region S2 between the peak wavelength of 550 nm and the absorption edge wavelength of 820 nm in such a manner as to correspond to resonance peaks with two modes, so that it is possible to increase the photovoltaic amount and increase conversion efficiency of the solar cell 60.

Example 2

Figure 15:
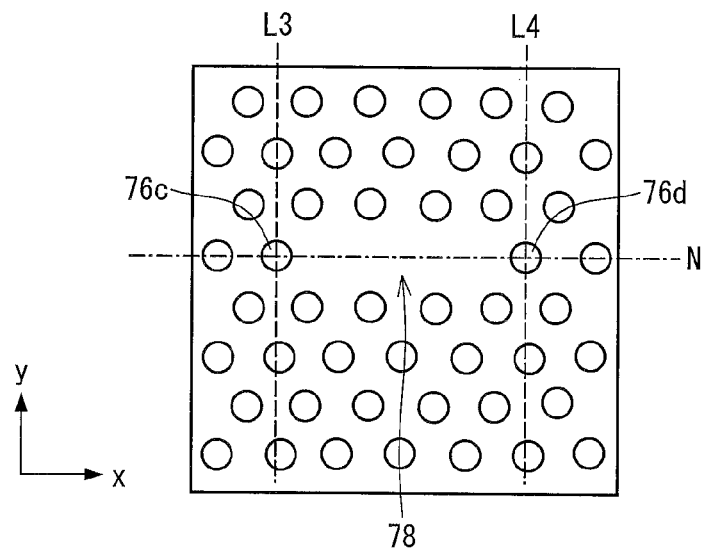
FIG. 15 is an explanatory plan view showing enlarged one of defect regions shown in FIG. 14.
Figure 16:
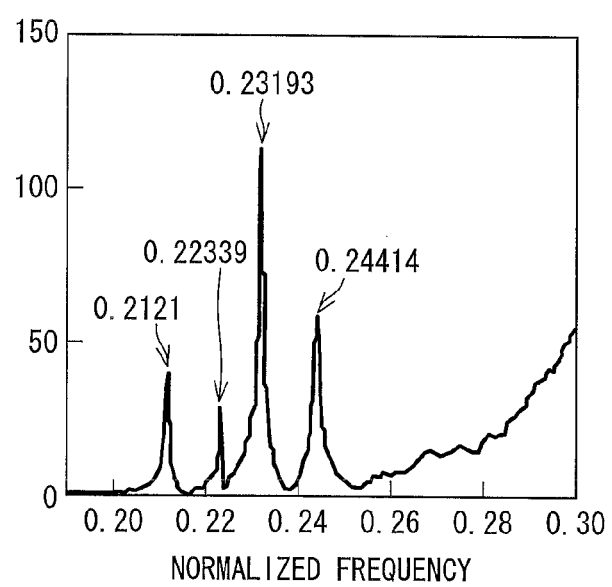
FIG. 16 is a graph showing, in terms of a relation between normalized frequency and light intensity, a resonance occurring at a defect region in a photonic crystal provided in the solar cell of Example 2.

Next, the following explains another example of the solar cell with reference to FIGS. 14 to 16.

FIG. 14 is a plan view showing another two-dimensional arrangement of nanorods and defects in a photonic crystal provided in a semiconductor layer 73 having the same laminate structure as that of the solar cell 60. FIG. 15 is an explanatory plan view showing enlarged one of defect regions shown in FIG. 14.

As shown in FIGS. 14 and 15, assuming that the nanorods 76 are positioned at corners and a center of each of a plurality of hexagons consisting of triangular lattices and there is provided a defect region 78 including the defects in the number of at least two (e.g. three lattice point linear defect that lacks three nanorods in FIG. 14) in the plurality of hexagons on a plan view and the plurality of hexagons are referred to as second units (indicated by thin lines in FIG. 11), since the pitch for the nanorods 76 is a, the second units are arranged two-dimensionally with a pitch of 4a or more in an x-direction and √3a in a y-direction, and the defects are arranged in a rectangular lattice manner with a pitch of 4a to 8a in an x-direction and 2√3a to 4√3a in a y-direction.

The result of the simulation by the FDTD method showed that also by continuously providing two or more defects in one unit, it is possible to split degeneracy of a resonance peak of light confined and resonated in the defect region 78. The result is shown in FIG. 16. FIG. 16 is a graph showing, in terms of a relation between normalized frequency and light intensity, a resonance occurring at the defect region 78. As shown in FIG. 16, there appears three resonant points by the three lattice point linear defect.

(Process for Manufacturing Solar Cell)

Figure 17:
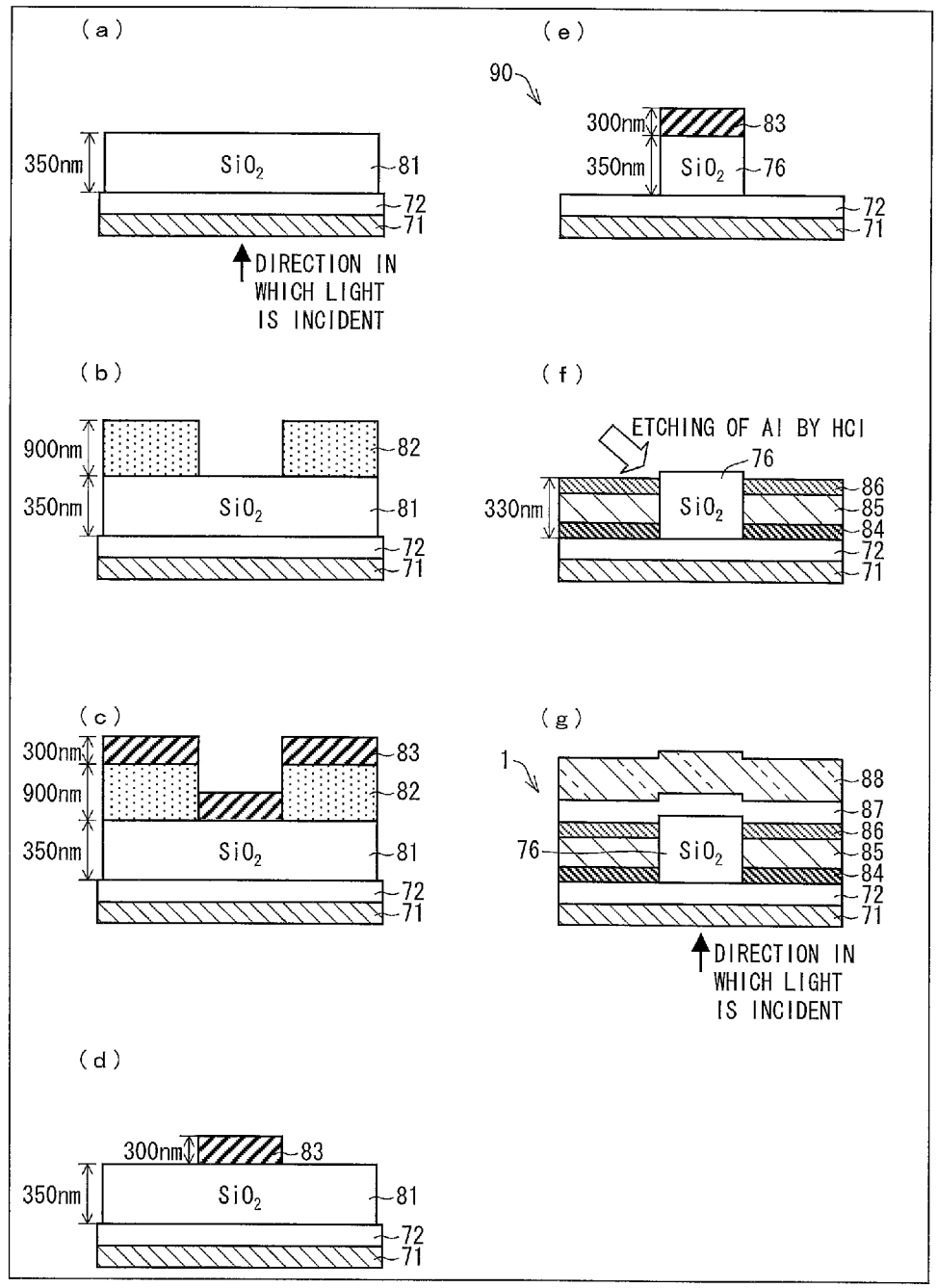
FIG. 17 is a process drawing showing a process for manufacturing a solar cell.

Lastly, a detailed explanation is made as to a process for manufacturing the solar cell 60 of the Example 1. FIG. 17 is a process drawing showing the process for manufacturing the solar cell 60.

Initially, as shown in (a) of FIG. 17, $SnO_2$ is evaporated on the glass substrate 71 to form the transparent conductive layer 72, and then $SiO_2$ from which the nanorods 76 are to be made is evaporated on the transparent conductive layer 72 to have a thickness of 350 nm, so that an $SiO_2$ layer 81 is formed.

Next, as shown in (b) of FIG. 17, a photoresist 82 is applied onto the $SiO_2$ layer 81 to have a thickness of 900 nm, and then patterns corresponding to positioning patterns of the nanorods 76 and the defects 77 are drawn by exposure to an electron beam. In a case where the photoresist 82 is a positive photosensitive material, the exposed portion is removed by development to form the positioning patterns of the nanorods 76 and the positioning patterns of the defects 77, each defined by the pitch a of 150 to 250 nm and the diameter r of 60 nm.

Subsequently, as shown in (c) of FIG. 17, Al is evaporated on the whole of the positioning patterns to have a thickness of 300 nm, so that an Al film 83 is formed.

Thereafter, as shown in (d) of FIG. 17, the photoresist 82 is removed so that the Al film 83 remains only at the portions where the nanorods 76 are formed. The $SiO_2$ layer 81 maintains the thickness of 350 nm.

Furthermore, as shown in (e) of FIG. 17, using the remaining Al film 83 as a mask, the unmasked $SiO_2$ is removed precisely by ICP-RIE (Inductive Coupled Plasma-Reactive Ion Etching) using carbon tetrafluoride ($CF_4$) as an etching gas. Thus, an intermediate 90 where the nanorods 76 are arranged two-dimensionally on the transparent conductive layer 72 is prepared.

Next, as shown in (f) of FIG. 17, a-Si is evaporated on the whole surface of the intermediate 90 and is doped with a p-impurity to form a p-a-Si layer 84, and a-Si is evaporated thereon to form i-a-Si layer 85, and a-Si is evaporated thereon and is doped with n-impurity to form an n-a-Si layer 86. The total thickness of the a-Si layers 84 to 86 is controlled to be approximately 330 nm, so that upper portions of the nanorods 76 with a thickness of 350 nm slightly protrude from the top surface of the n-a-Si layer 86.

Furthermore, each of the a-Si layers 84 to 86 has a thickness which is thinner by approximately ⅓ times or more than the total of the thickness of the nanorods 76 (350 nm) and the thickness of the Al film 83 thereon (300 nm), so that each of the a-Si layers 84 to 86 is separated into a portion formed on the transparent conductive layer 72 and a portion formed on the Al film 83. That is, the Al film 83 remaining on the nanorods 76 is exposed without its sides covered by a-Si.

Subsequently, the Al film 83 remaining on the nanorods 76 is removed by wet etching using hydrochloric acid (HCl). Since the Al film 83 remaining on the nanorods 76 exposes its sides, it is possible to remove the Al firm 83 by wet etching.

Lastly, as shown in (g) of FIG. 17, $SnO_2$ is evaporated to form a transparent conductive layer 87 and a metal electrode layer 88 is laminated, so that the solar cell 1 is completed. A portion of the transparent conductive layer 87 and a portion of the metal electrode layer 88 which portions are positioned above the nanorod 76 slightly protrude upward since the portions reflect a slight protrusion of the nanorod 76 from the top surface of the n-a-Si layer 86.

Second Embodiment

Configuration of Solar Cell

Figure 21:
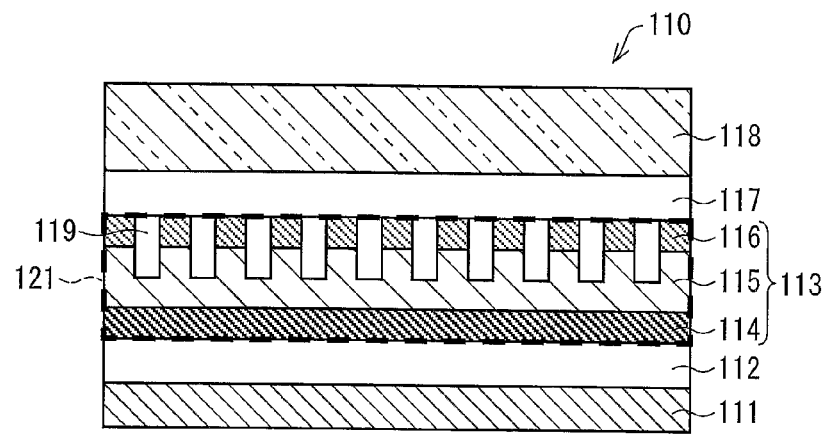
FIG. 21 is a cross sectional view showing one configuration example of a solar cell panel.
Figure 22:
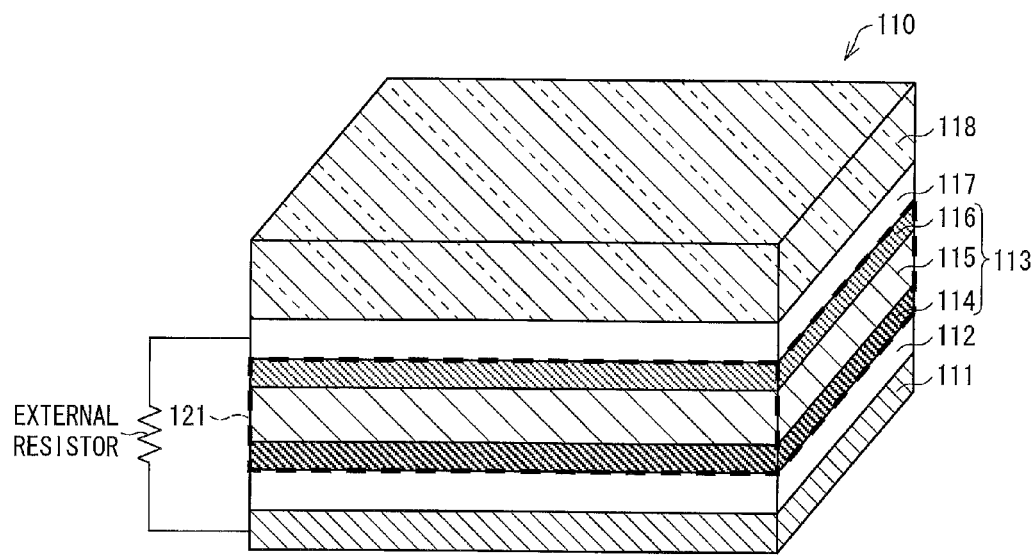
FIG. 22 is a perspective view showing a configuration of a solar cell of the present invention.

FIG. 21 is a cross sectional view showing a configuration of a solar cell 110 of the present invention. FIG. 22 is a perspective view showing the configuration of the solar cell 110.

The solar cell 110 is an element for converting incident light into a current by photoelectric conversion. The solar cell 110 can be used also as a device for converting light into an electric signal, such as a light detection sensor.

The solar cell 110 includes a semiconductor layer (photoelectric conversion layer) 113 for photoelectrically converting incident light. The semiconductor layer 113 has therein a photonic crystal 121 obtained by forming nanorods (columnar mediums) 119 whose refractive index is different from that of the semiconductor layer 113.

The solar cell 110 enhances a light absorption ratio by strongly resonating the wavelength of light in a state corresponding to a band edge provided by the photonic crystal 121. A structure of the semiconductor layer 113 in which the photonic crystal 121 is formed is detailed later.

The solar cell 110 includes: a back surface metal electrode 111 (metal layer) at the outermost layer positioned oppositely to a side where light is incident to the solar cell 110; a transparent conductive film 112 laminated on the back surface metal electrode 111; the semiconductor layer 113 laminated on the transparent conductive film 112; a transparent conductive film 117 laminated on the semiconductor layer 113; and a glass 118 laminated on the transparent conductive film 117. The transparent conductive film 117 is one of two layers made of a medium whose refractive index is smaller than that of the medium of the semiconductor layer 113, and the transparent conductive film 112 is the other of the two layers.

In the solar cell 110, a surface of the glass 118 which surface is opposite to the surface contacting the transparent conductive film 117 is a surface where light is incident. The solar cell 110 photoelectrically converts, at the semiconductor layer 113, light incident to the incident surface so as to generate a current corresponding to intensity of the incident light. Furthermore, for example, the back surface metal electrode 111 and the transparent conductive film 117 that sandwich the semiconductor layer 113 are connected with each other via an external resistor, so that the current can be outputted as an electric signal to the outside.

Here, the surface (side) of the solar cell 110 where light is incident is referred to as a front surface (side), and the surface (side) of the back surface metal electrode 111 which surface is opposite to a surface contacting the semiconductor layer 113 is referred to as a back surface (side). Similarly, the surface (side) of each of the films constituting the solar cell 110 which surface is closer to the surface where light is incident is referred to as a front surface (side), and the surface (side) of each of the films which surface is closer to the back surface metal electrode 111 is referred to as a back surface (side).

The glass 118 is made of a material whose refractive index is approximately 1.52 for example.

The back surface metal electrode 11 is made of a metal which reflects light strongly and absorbs light little, such as Ag and Al. The back surface metal electrode 111 extracts a current generated by photoelectric conversion at the semiconductor layer 113 and outputs the current to the outside.

The back surface metal electrode 111 may also serve as a reflective plate. The back surface metal electrode 111 can reflect light having been transmitted by the semiconductor layer 113 without photoelectric conversion, so that the light travels to the semiconductor layer 13 again. By providing the back surface metal electrode 111 in such a manner as to cover the whole back surface of the semiconductor layer 113, it is possible to surely reflect light having been transmitted by the semiconductor layer 113, so that the solar cell 110 can have a high light absorption ratio.

The transparent conductive films (TCO; Transparent Conducting Oxide) 112 and 117 are transparent conductive films, and are positioned in such a manner as to sandwich the semiconductor layer 113. The transparent conductive films 112 and 117 are made of mediums whose refractive indices are smaller than the refractive index of the medium of the semiconductor layer 113, and are made of ITO, ZnO, or $SnO_2$ for example.

The semiconductor layer 113 is a photovoltaic material, such as a-Si (amorphous silicon). The semiconductor layer 113 is a photovoltaic layer for photoelectrically converting incident light into a current. In the present embodiment, the semiconductor layer 113 is a p-i-n semiconductor consisting of an n-semiconductor (n-semiconductor layer) 114, an i-semiconductor (intrinsic semiconductor layer) 115, and a p-semiconductor (p-semiconductor layer) 116 which are laminated in this order from the back surface side (side where the transparent conductive film 112 is provided).

The semiconductor layer 113 has a two-dimensional photonic crystal 121 having a periodic structure in which nanorods 119 whose refractive index is smaller than refractive indices of the n-semiconductor 114, the i-semiconductor 115, and the p-semiconductor 116 are arranged two-dimensionally and regularly.

(Configuration of Photonic Crystal)

Next, an explanation is made as to a configuration of the photonic crystal 121.

As shown in FIG. 21, the photonic crystal 121 is provided in the semiconductor layer 113. The photonic crystal 121 is a two-dimensional photonic crystal obtained by periodically arranging a plurality of nanorods 119 in the medium of the semiconductor layer 113 whose thickness substantially corresponds to the wavelength of light.

In the semiconductor layer 113, a region where the nanorods 119 are provided is the photonic crystal 121. In the present embodiment, the nanorods 119 are provided throughout the whole surface of the semiconductor layer 113.

The nanorods 119 are made of a material whose refractive index is smaller than that of a-Si constituting the n-semiconductor 114, the i-semiconductor 115, and the p-semiconductor 116. That is, the nanorods 119 constitute a low refractive index region in the semiconductor layer 113. The nanorods 119 are made of a material having an insulating function and high transmittance. The nanorods 119 are made of a material whose refractive index is approximately between 1.0 and 2.0, such as air and $SiO_2$ whose refractive index is 1.45.

Besides, the material for the nanorods 30 may be JAS (transparent resin material) whose refractive index is approximately 1.6, or HSQ (Hydrogen Silsesquioxane) used as a SOG (Spin-on Glass) material. For example, FOX® (manufactured by Dow Corning Toray) etc. may be used as the HSQ.

The thickness of the nanorod 119 (length of the nanorod 119 in a thickness direction of the semiconductor layer 113) is designed to be 1/1 or not more than 1/4 of the thickness of the semiconductor layer 113.

Furthermore, the nanorods 119 are provided in the semiconductor layer 113 to have a pillar shape, such as a columnar shape.

Figure 23:
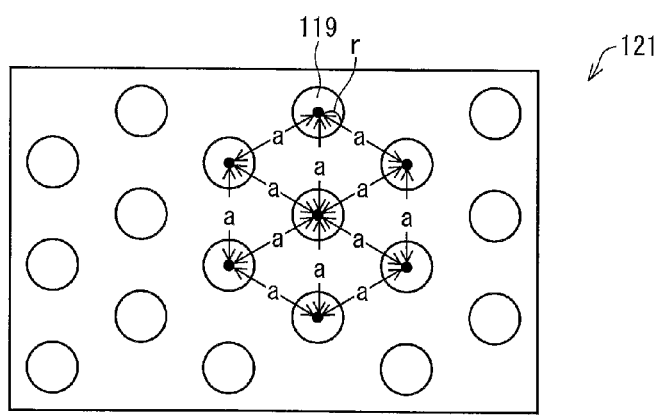
FIG. 23 is a plan view showing a configuration of a photonic crystal having a triangular lattice structure in a photonic conversion element of the present invention.

FIG. 23 is a plan view showing a configuration of the photonic crystal 121 in which the nanorods 119 are arranged at corners of a triangular lattice. As shown in FIG. 23, in the photonic crystal 121, the nanorods 119 are arranged two-dimensionally so that a band edge is provided at a point Γ in a later-mentioned reciprocal lattice space.

Specifically, the nanorods 119 are arranged periodically with a pitch a of not less than λ/4 and not more than λ with respect to a wavelength λ. The wavelength λ is a wavelength defined by a band edge as mentioned later. That is, the wavelength λ is a resonant peak wavelength of a wavelength at which light is resonated in the photonic crystal 121.

Furthermore, the nanorods 119 are positioned on corners of a triangle on a plan view of the photonic crystal 121, so that the nanorods 119 are positioned periodically on corners and a center of a hexagon. That is, the photonic crystal 121 has a structure in which the nanorods 119 are arranged two-dimensionally and in a triangular lattice manner.

Figure 24:
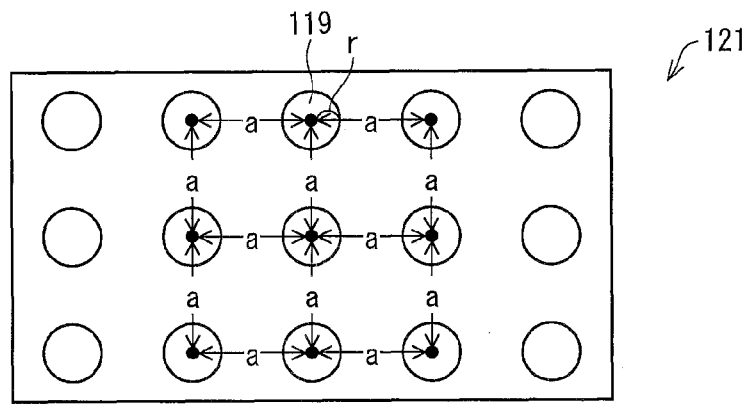
FIG. 24 is a plan view showing a configuration of a photonic crystal having a square lattice structure in a photonic conversion element of the present invention.

Alternately, as shown in FIG. 24, the nanorods 119 may be positioned on corners of a rectangle on a plan view of the photonic crystal 121. That is, the photonic crystal 121 has a structure in which the nanorods 119 are arranged two-dimensionally and in a square lattice manner.

FIG. 24 is a plan view showing a configuration of the photonic crystal 121 in which the nanorods 119 are arranged in a square lattice manner.

In either lattice manner, a band edge can be provided at the point Γ in the later-mentioned reciprocal lattice space.

The radius of the nanorod 119 is preferably not less than 0.2a and not more than 0.4a based on the pitch a as a reference.

Next, an explanation is made as to a band edge which is generated in the solar cell 110 in which the nanorods 119 are provided in the semiconductor layer 113.

(Band Edge)

Figure 25:
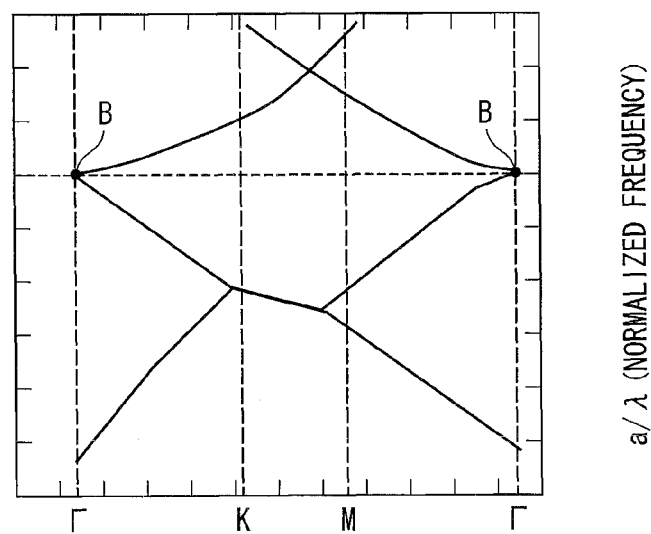
FIG. 25 is a view showing a photonic band of a photonic crystal.

FIG. 25 is a view showing a photonic band of the photonic crystal 121. The position and orientation of a triangular lattice (one planar cross sectional structure of a hexagonal close-packed structure) in the reciprocal lattice space has been already explained above with reference to FIG. 4.

In FIG. 25, a longitudinal axis indicates normalized frequency and a lateral axis indicates the position and direction in the reciprocal lattice space.

The normalized frequency is used as a parameter because the pitch a of the photonic crystal 121 is related to the frequency of light, and is represented by a/λ. Accordingly, in FIG. 25, the wavelength λ is smaller as the scale mark of the graph is closer to the top of the longitudinal axis of the graph.

Individual bands shown in FIG. 25 are obtained by connecting points indicative of wavelengths of light resonated in the photonic crystal 121.

As described above, the photonic crystal 121 is designed such that the plurality of nanorods 119 are arranged periodically in such a manner that the pitch a is not less than 1/4 and not more than 1 with respect to the wavelength λ. Accordingly, as shown in FIG. 25, a band edge B which is the extremum of a photonic band of the photonic crystal 121 is provided at the point Γ.

At the band edge B, light with the wavelength λ of the resonant peak corresponding to the normalized frequency is resonated strongly through the whole surface of the photonic crystal 121. The resonance effect at the band edge B allows lengthening the lifetime of light incident to the semiconductor layer 113. Consequently, the interaction between the semiconductor layer 113 and light during the lengthened lifetime allows increasing the light absorption ratio of the semiconductor layer 113.

As described above, with the configuration of the photonic crystal 121, it is possible to use the band edge B which allows only light incident from a direction vertical to the photonic crystal 121 referred to as the point Γ to resonate.

Using the band edge B, out of light incident to the photonic crystal 121, light incident from a vertical direction and with a wavelength of λ can be confined and resonated in the photoelectric crystal 121. The light with a wavelength of λ resonated in the photoelectric crystal 121 is absorbed by the medium of the photoelectric conversion layer.

Therefore, it is possible to increase the light absorption ratio of the solar cell.

Figure 26:
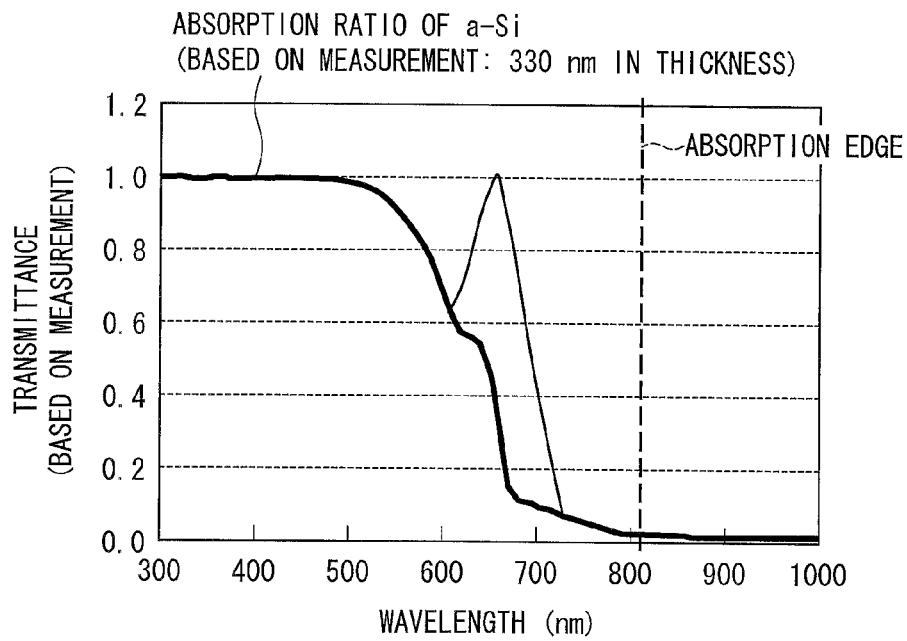
FIG. 26 is a view showing an absorption wavelength of a solar cell of the present invention.

FIG. 26 shows the absorption wavelength of the solar cell 110. As shown in FIG. 26, the solar cell 110 exhibits an improved absorption ratio at the resonant wavelength of the band edge B in addition to the normal absorption wavelength of the semiconductor made of a-Si. In the solar cell 110 in accordance with the present embodiment, it is possible to increase the low absorption ratio of light with the wavelength of approximately 650 nm which is between the wavelength of the absorption edge of a-Si (approximately 820 nm) and the peak wavelength of absorption (520 nm). The target wavelength can be changed by changing the pitch a for the nanorods and consequently changing the normalized frequency.

The normalized frequency defined by the band edge B is approximately between 0.3 and 0.5.

As described above, in the solar cell 110, by strongly resonating incident light from a specific angle in the photonic crystal 121, it is possible to increase the light absorption ratio at the whole surface. In particular, by providing a resonant peak in the wavelength band with a low absorption ratio, i.e.

a band between the absorption edge of the semiconductor and the absorption peak, it is possible to increase the absorption ratio of the solar cell 110 as a whole.

Besides, in the solar cell 110, only light incident from a direction perpendicular to the solar cell 110, referred to as the point Γ, is resonated. Light that can be resonated in the solar cell 110 is only light incident with an incident angle of approximately 90°±1°.

That is, with the configuration of the photonic crystal 121, when the incident angle of light from a direction perpendicular to the semiconductor layer 113 is referred to as θ1, it is possible to cause the light with the incident angle of approximately $-1° \leq \theta1 \leq 1°$ to resonate at the band edge B provided by the point Γ. Here, θ1 is determined by a length of the band in the same normalized frequency and in an in-plane direction (M direction or K direction) at the band edge B.

As described above, light with the wavelength λ of the resonant peak which is resonated in the semiconductor layer 113 is absorbed by the medium of the semiconductor layer 113.

That is, with the solar cell 110, it is possible to limit the incident angle of light with the wavelength to be resonated strongly. Accordingly, the solar cell 110 can be used as, for example, an optical sensor element such as an element for sensing the incident angle of light.

Furthermore, in the photonic crystal 121 of the solar cell 110, the pitch a for the nanorods 119 is set to be ¼ to 1 time with respect to the wavelength λ, so that the band gap does not exist.

Figure 27:
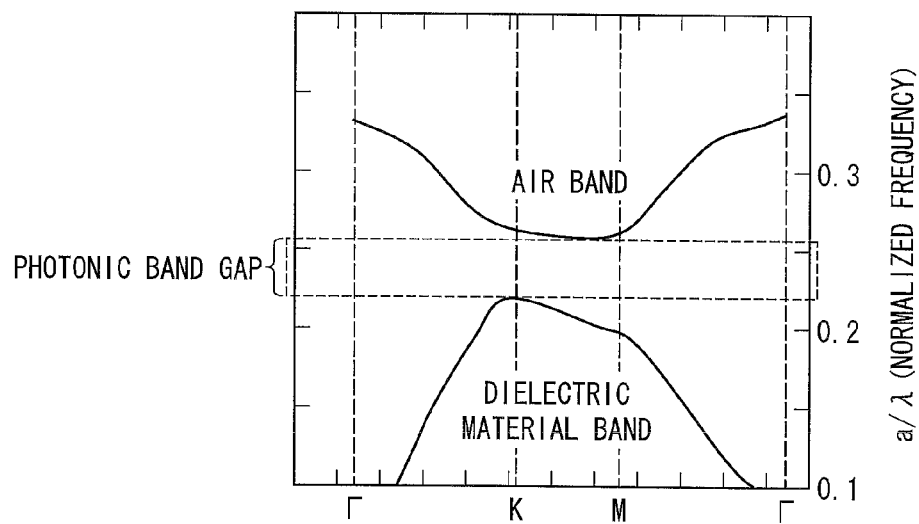
FIG. 27 is a view showing a photonic band having a band gap.

FIG. 27 is a view showing a photonic band where a band gap exists. The photonic band is a wavelength band of light that cannot exist in the photonic crystal (band gap).

For example, as shown in FIG. 27, in a case where a photonic crystal has a band gap between a high dielectric band and a low dielectric band, light with a wavelength within the band gap cannot enter the photonic crystal. Consequently, the absorption ratio of light with a wavelength band corresponding to the normalized frequency drops.

On the other hand, the solar cell 110 is designed to select a resonance condition that the pitch a for the nanorods 119 is ¼ to 1 time with respect to the wavelength λ. This prevents formation of a band gap within a wavelength region within which light can be converted into a photovoltaic power by the photonic crystal 121. Consequently, it is possible to increase the light absorption ratio without reflection of light with a specific wavelength by the band gap.

As described above, the solar cell 110 can have efficient intake of light with a specific wavelength and at a specific incident angle from the outside due to the photonic crystal 121 provided in the semiconductor layer 113. Accordingly, by increasing light absorption per unit area, it is possible to increase the photovoltaic amount of the optical semiconductor layer and improve directivity of the optical semiconductor layer.

(Design of Photonic Crystal Based on Q Value)

Discussion of the magnitude of coupling in light between the outside of the solar cell 110 and the photonic crystal in terms of a Q value is the same as the discussion made with respect to the solar cell 1.

For the purpose of increase in light absorption by the photovoltaic device, which is a goal to be achieved by the present invention, it is necessary that light coupled to the resonator made of the photonic crystal is subjected to an absorption process by the photovoltaic device. This effect is maximized when $\kappa_V = \alpha (Q_V = Q_\alpha)$ also in the photonic crystal in which nanorods are arranged periodically so as to form the band edge B.

In view of the above, in order to increase light absorption by the photovoltaic device, it is necessary to meet the relation $\kappa_V = \alpha(Q_V = Q_\alpha)$, which requires making $\kappa_V$ larger (making $Q_V$ smaller). In order to make $\kappa_V$ larger (make $Q_V$ smaller), it is necessary to increase the ratio of coupling of the resonator as a whole constituted by the photonic crystal (device as a whole) (decrease the Q value of the photovoltaic device, i.e. $Q_T$ mentioned above).

Besides, in a case where the coefficient $\kappa_V$ is substantially equal to the absorption coefficient α and light absorption is not less than a certain level (a is approximately 5.0% or more), it is possible to broaden a target wavelength band (band of resonant wavelength) where the light absorption effect is high in particular. This yields a great effect of broadening a resonant wavelength band of light with an angle dependency.

(Configuration for Increasing Light Reception of Solar Cell)

In the case where the incident angle of light entering the photonic crystal is limited to a certain angle range and there is an angle dependency as the solar cell 110 in accordance with the Second Embodiment, it is preferable to add a configuration for increasing light reception of a solar cell.

Figure 19:
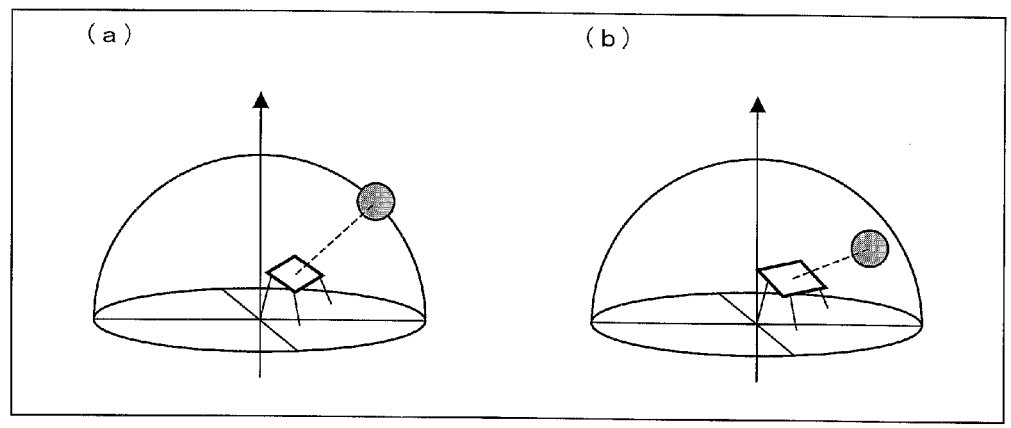
FIG. 19 is an explanatory view showing a concept of a sun tracking system.

One example of such a configuration is a tracking system for changing the direction of a solar cell panel so that a normal direction of the solar cell panel faces the sun, i.e. the normal direction is parallel to the sunlight. (a) and (b) of FIG. 19 are explanatory views showing the concept of the tracking system. This allows always securing a large amount of light reception per unit area of the solar cell panel, thereby increasing the light absorption ratio of the solar cell.

Figure 20:
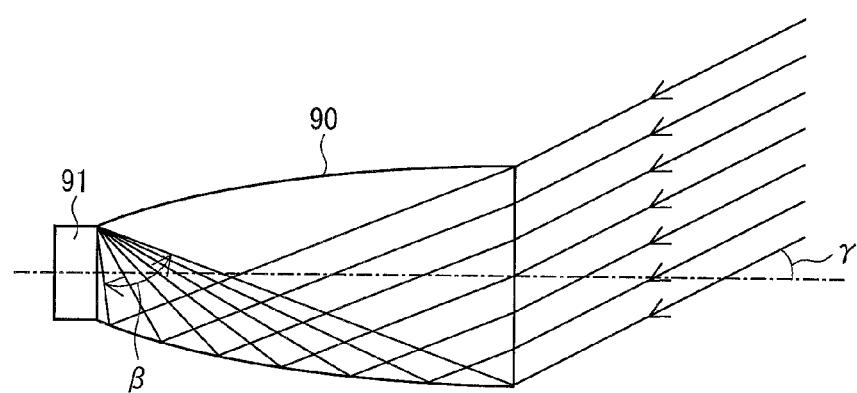
FIG. 20 is an explanatory view showing a light-converging operation of a parabolic light-converging element.

Another example of such a configuration is addition of a device having a lens effect, such as a parabolic concentrator. FIG. 20 is an explanatory view showing a light converging operation of a parabolic concentrator 90. Parallel beams of light incident to a light-receiving surface of the parabolic concentrator 90 with an incident angle γ is reflected inside the parabolic concentrator 90 to be a light flux whose angle is narrowed down to an angle range β defined by a relation with the incident angle γ to the solar cell panel 91, and is converged onto the solar cell panel 91.

Consequently, light having been incident to an area wider than the light receiving area of the solar cell panel 91 is converged, so that light absorption of the solar cell panel 91 can be increased and the light absorption ratio can be increased.

(Modification Example of Photonic Crystal)

Next, an explanation is made as to a modification example of the photonic crystal.

Figure 28:
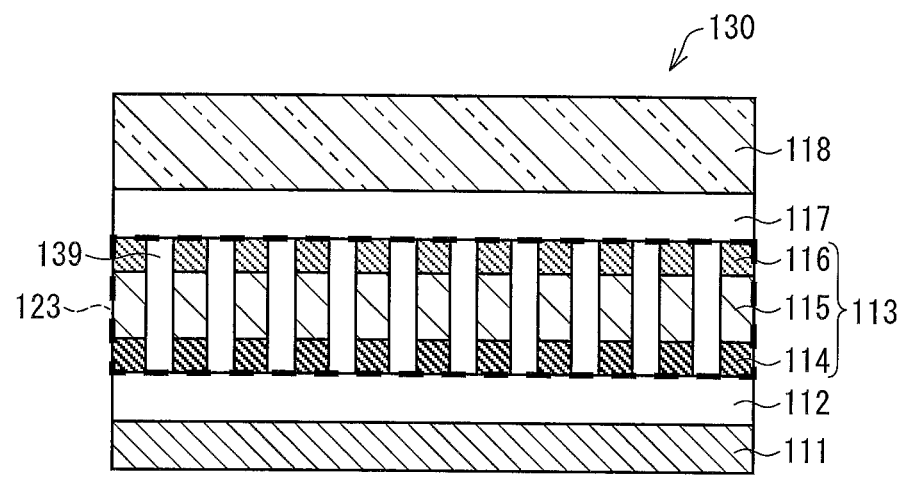
FIG. 28 is a cross sectional view showing a configuration of a solar cell of the present invention.

FIG. 28 is a cross sectional view showing a configuration of a solar cell 130 of the present invention.

The solar cell 130 has the same configuration as the solar cell 110 except that the photonic crystal 121 of the solar cell 110 is replaced with a photonic crystal 123.

The photonic crystal 123 is different from the photonic crystal 121 in that the height of nanorods 139 is the same as the thickness of the semiconductor layer 113. The nanorods 139 provided in the photonic crystal 123 are columnar holes penetrating the semiconductor layer 113.

Furthermore, the shape of the nanorod is not limited to columnar one of the nanorod 119 or 139, and may be one whose cross section is trapezoidal.

Figure 29:
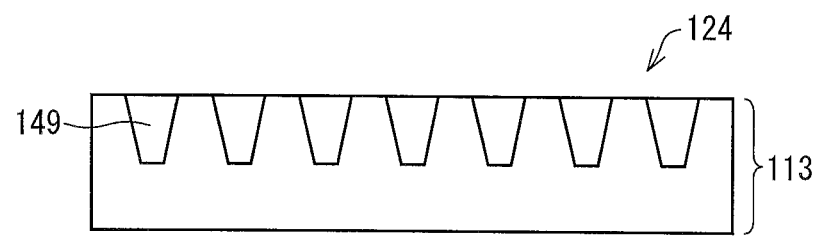
FIG. 29 is a cross sectional view showing a configuration of a photonic crystal having nanorods whose cross sections are trapezoidal.

FIG. 29 is a cross sectional view showing a configuration of a photonic crystal in which nanorods whose cross sections are trapezoidal are provided.

A photonic crystal 124 shown in FIG. 29 is designed such that nanorods 149 whose cross sections are trapezoidal are provided in the semiconductor layer 113. Each of the nanorods 149 is designed such that the area of the top surface thereof on the surface of the semiconductor layer 113 is larger than the area of the bottom surface thereof inside the semiconductor layer 113. This design allows easier processing when forming the nanorods 149 in the semiconductor layer 113 by etching etc.

Figure 30:
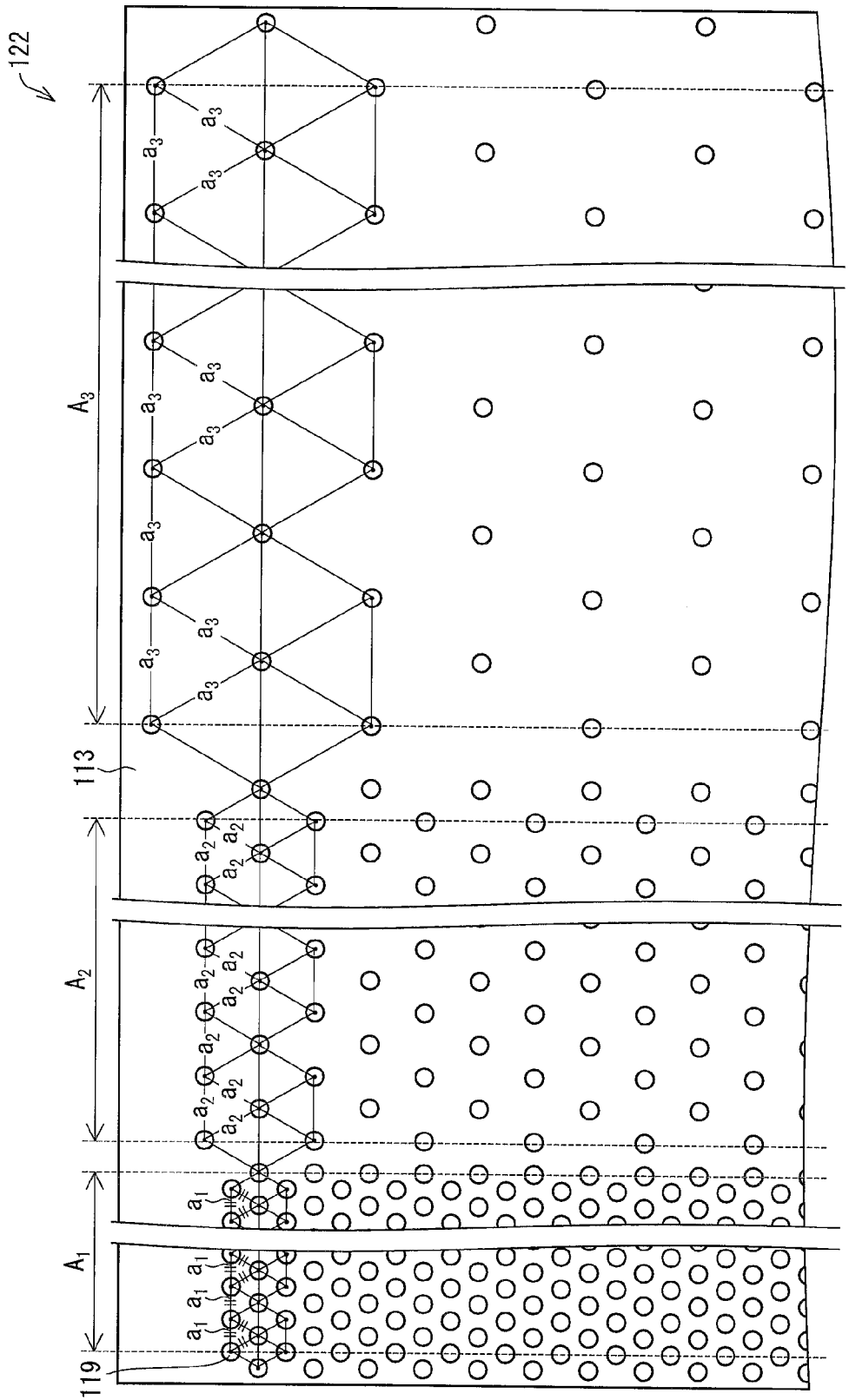
FIG. 30 is a plan view showing a configuration of a photonic crystal in which individual regions have different pitches for nanorods.

FIG. 30 is a plan view showing a configuration of a photonic crystal in which individual regions have different pitches for nanorods.

As shown in FIG. 30, one photonic crystal may include a plurality of regions having different pitches for nanorods.

As shown in FIG. 30, the photonic crystal 122 is provided with a region A1 where the nanorods 119 are provided in the semiconductor layer 113 with a pitch a1, a region A2 where the nanorods 119 are provided in the semiconductor layer 113 with a pitch a2 (a2>a1), and a region A3 where the nanorods 119 are provided in the semiconductor layer 113 with a pitch a3 (a3>a2).

The pitches a1, a2, and a3 are different constant values, and are not less than ¼ and not more than 1 with respect to the wavelength λ.

As shown in FIG. 30, the areas A1, A2, and A3 are provided in such a manner that each of the areas A1, A2, and A3 includes approximately 50 to 100 of the nanorods 119 that are arranged with an equal pitch in a direction parallel to a side of the semiconductor layer 113 on a plan view of the semiconductor layer 113.

Consequently, in the areas A1, A2, and A3, at the respective points Γ, different band edges are provided. Accordingly, wavelengths λ1, λ2, and λ3 corresponding to normalized frequencies of the points F at the regions λ1, λ2, and λ3 are resonant wavelengths.

As described above, the photonic crystal 122 is designed to allow light with different wavelengths λ1, λ2, and λ3 to resonate in one photonic crystal 122, so that the absorption ratios of light with a plurality of wavelengths can be increased by using respective regions.

(Process for Manufacturing Solar Cell)

A process for manufacturing the solar cell 110 may be one described with reference to FIG. 17.

Third Embodiment

Figure 31:
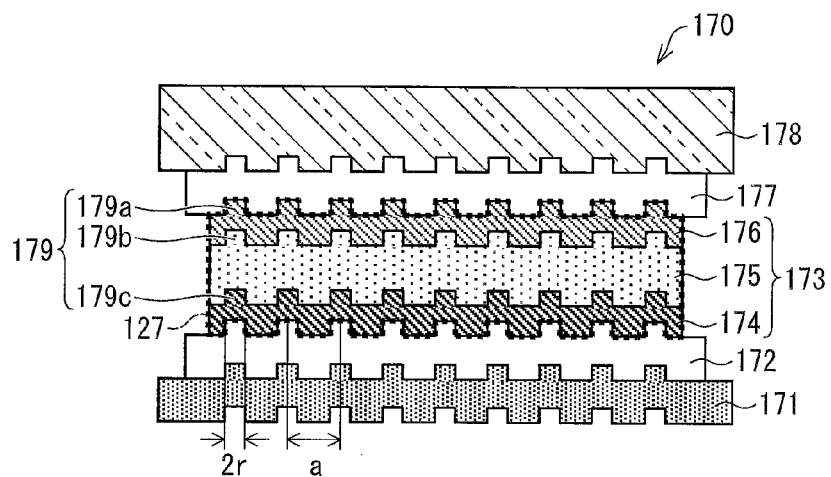
FIG. 31 is a cross sectional view showing a configuration of a solar cell in accordance with Second Embodiment of the present invention.
Figure 32:
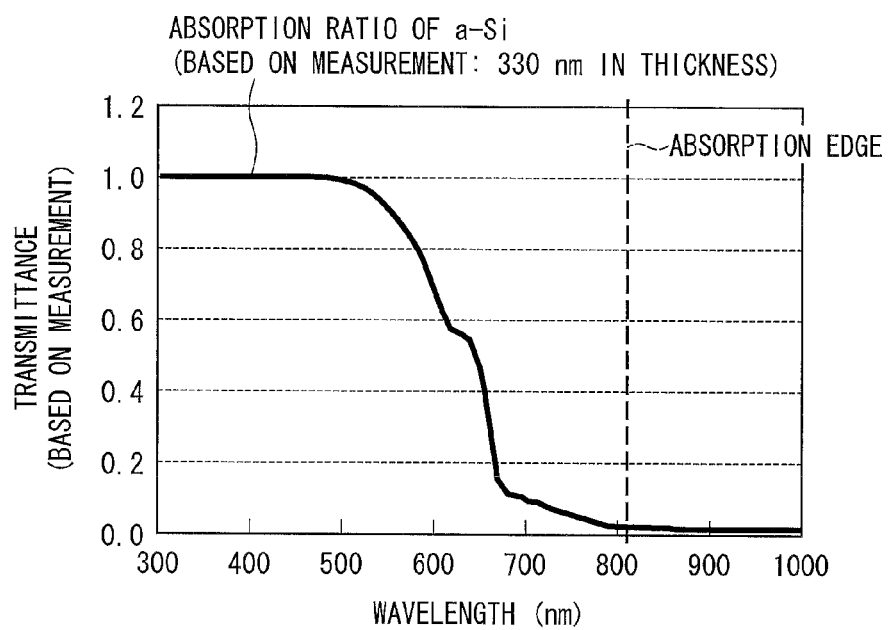
FIG. 32 is a graph showing a light absorption ratio of a-Si with respect to a wavelength of light.
Figure 33:
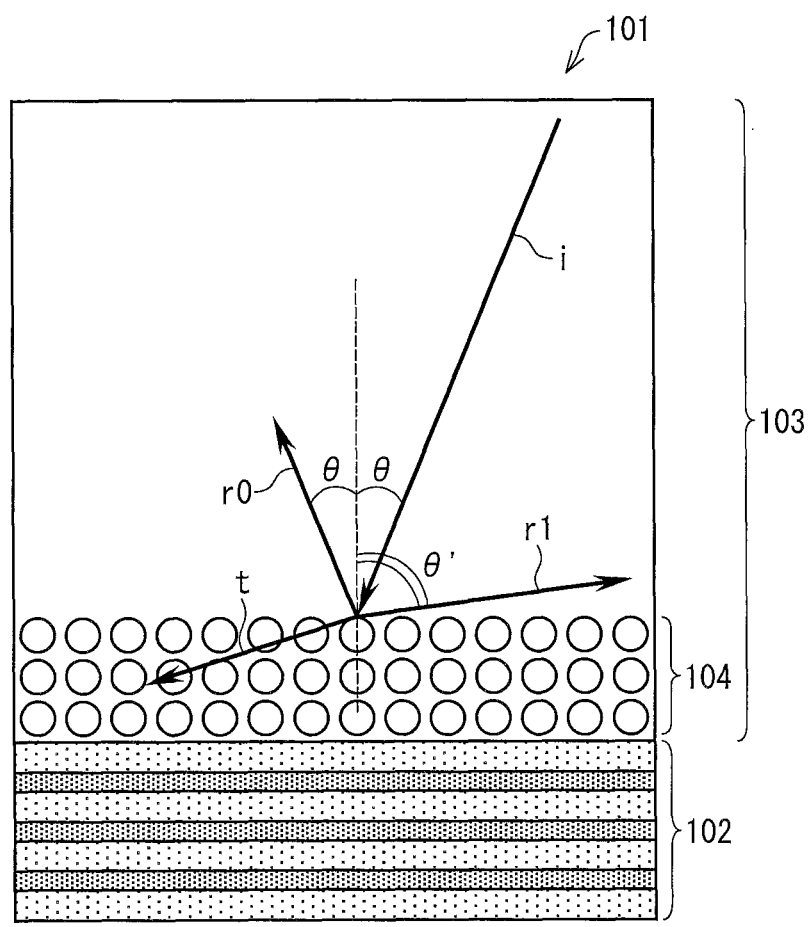
FIG. 33 is a view schematically showing a configuration of a conventional solar cell having a photonic crystal.
Figure 34:
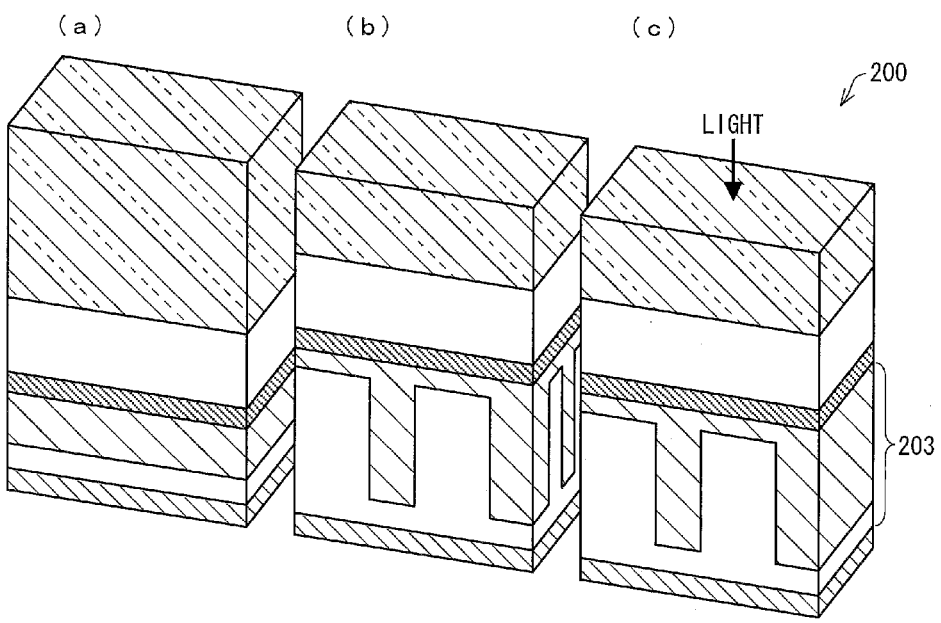
FIG. 34 is a perspective view showing a configuration of a solar cell having a conventional photonic crystal.

The following explains a solar cell in accordance with Third Embodiment of the present invention with reference to FIG. 31. For convenience of explanation, members having the same functions as those described in First Embodiment are given the same reference signs and explanations thereof are omitted here.

FIG. 31 is a cross sectional view showing a configuration of a solar cell 170 in accordance with the present embodiment.

A semiconductor layer 173 of the solar cell 170 includes an n-semiconductor 174, an i-semiconductor 175, and a p-semiconductor 176 which are laminated in this order from the back surface side. The n-semiconductor 174, the i-semiconductor 175, and the p-semiconductor 176 are provided with a plurality of protrusions 179c, a plurality of protrusions 179b, and a plurality of protrusions 179a, respectively. The protrusions 179c, the protrusions 179b, and the protrusions 179a are arranged at corresponding positions. The protrusions 179c, the protrusions 179b, and the protrusions 179a laminated on the corresponding positions serve as nanorods 179.

The photonic crystal 127 is obtained by providing the nanorods 179 in the semiconductor layer 173.

The nanorods 179 may consist of the protrusions 179c, the protrusions 179b, and the protrusions 179a respectively positioned on the n-semiconductor 174, the i-semiconductor 175, and the p-semiconductor 176 as in the case of the solar cell 170. Alternatively, the nanorods 179 may consist of a plurality of protrusions positioned on any one of the n-semiconductor 174, the i-semiconductor 175, and the p-semiconductor 176. Photoelectric conversion mainly occurs in the i-semiconductor 175. Accordingly, in the case of positioning protrusions on any one of the n-semiconductor 174, the i-semiconductor 175, and the p-semiconductor 176, the protrusions are preferably positioned at the interface between the n-semiconductor 174 and the i-semiconductor 175 or at the interface between the i-semiconductor 175 and the p-semiconductor 176.

The pitch, the radius etc. for the nanorods 179 are the same as those described in Second Embodiment.

That is, when a wavelength of resonance peak of the photonic crystal 127 is λ, the nanorods 179 are arranged two-dimensionally and periodically with a pitch of not less than ¼ and not more than 1 with respect to λ.

Furthermore, the photonic crystal 127 is designed such that a relation $0.26\, Q_V \leq Q_\alpha \leq 0.96\, Q_V$ is met, wherein $Q_V$ is a Q value representing a magnitude of a resonance effect yielded by coupling between the photonic crystal 127 and an outside and is proportional to an inverse number of a coefficient $\kappa_V$ indicative of strength of coupling between the photonic crystal 127 and the outside, and $Q_\alpha$ is a Q value representing a magnitude of a resonance effect yielded by a medium of the semiconductor layer 173 and is proportional to an inverse number of a coefficient $\alpha$ of absorption of light by the medium of the semiconductor layer 173.

As a result of etching etc., the glass substrate 178 has a plurality of concavities at a region where the nanorods 179 are to be formed. The concavities are formed on the back surface of the glass substrate 178 to form a hexagonal lattice constituted by triangular lattices neighboring each other with a pitch a.

Then, on the surface of the glass substrate 178 where the concavities are formed, a transparent conductive film 177 made of TCO, the p-semiconductor 176 made of a-Si, the i-semiconductor 175 made of a-Si, the n-semiconductor 174 made of a-Si, a transparent conductive film 172 made of TCO, and a back surface metal electrode 171 (metal layer) are laminated. Thus, the layers laminated on the glass substrate 178 have concavities and convexities corresponding to the concavities formed on the glass substrate 178.

Consequently, the solar cell 170 can yield the same effect as that yielded by the solar cells 110, 130, 150, and 160.

Fourth Embodiment

The following explains a solar cell in accordance with Fourth Embodiment of the present invention with reference to FIGS. 35 to 38. For convenience of explanation, members having the same functions as those described in Second Embodiment are given the same reference numerals and explanations thereof are omitted.

The solar cell in accordance with the present embodiment is in principle the same as the solar cell in accordance with Second Embodiment. That is, the solar cell in accordance with the present embodiment has a structure capable of increasing a light absorption ratio of a photonic conversion element having a photonic crystal structure that meets the relation $0.26\, Q_V \leq Q_\alpha \leq 0.96\, Q_V$ and that yields a resonant effect at a band edge, thereby increasing a photovoltaic power at the above wavelength band ranging approximately from 520 nm to 820 nm.

(Configuration Example of Solar Cell)

Figure 35:
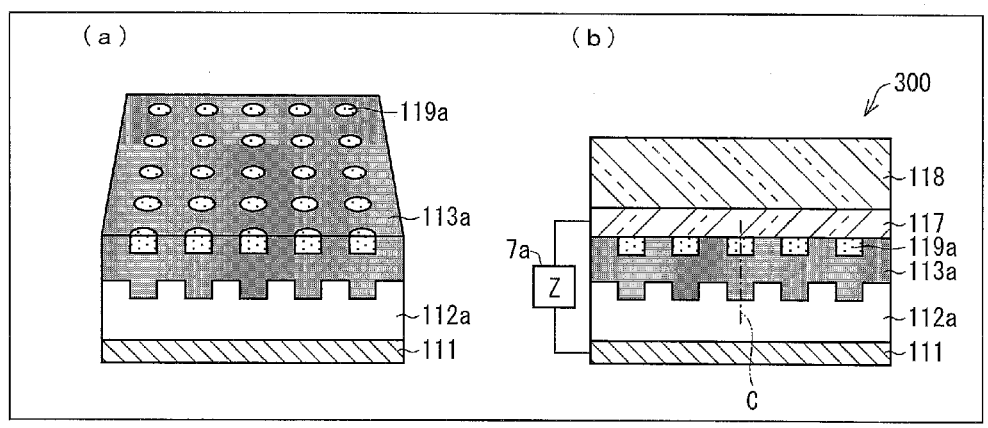
FIG. 35 is a view showing an example of a laminate structure of a solar cell of the present invention. (a) of FIG. 35 shows a perspective view of an extracted laminate part from a photoelectric conversion layer to a metal layer at a back surface side of the solar cell. (b) of FIG. 35 shows a cross section of the solar cell as a whole.
Figure 36:
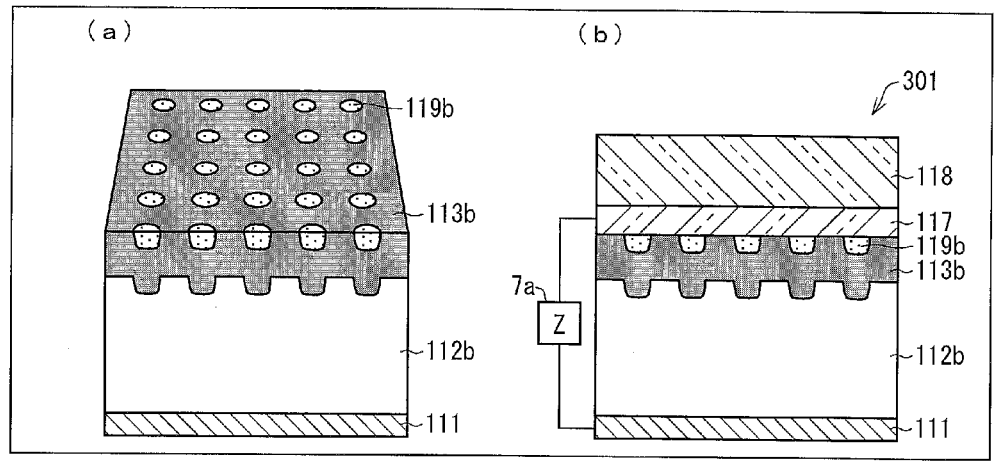
FIG. 36 is a view showing a modification example of the laminate structure shown in FIG. 35, designed to be different from the laminate structure of the solar cell shown in FIG. 35 in terms of the shape of a nanorod and the thickness of a transparent conductive layer at a back surface side.
Figure 37:
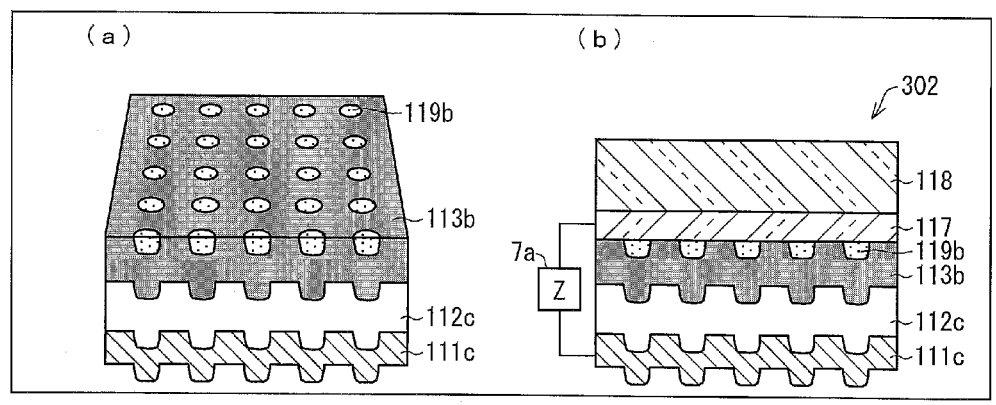
FIG. 37 is a view showing another example of a laminate structure of a solar cell of the present invention, designed to be different from the laminate structure of the solar cell shown in FIG. 36 in terms of the shapes of a transparent conductive layer and a metal layer at a back surface side.

FIG. 35 is a view showing an example of a laminate structure of a solar cell of the present invention. (a) of FIG. 35 shows a perspective view of an extracted laminate part from a photoelectric conversion layer to a metal layer at a back surface side of the solar cell. (b) of FIG. 35 shows a cross section of the solar cell as a whole. FIG. 36 is a view showing a modification example of the laminate structure shown in FIG. 35, designed to be different from the laminate structure of the solar cell shown in FIG. 35 in terms of the shape of a nanorod and the thickness of a transparent conductive layer at a back surface side. FIG. 37 is a view showing another example of a laminate structure of a solar cell of the present invention, designed to be different from the laminate structure of the solar cell shown in FIG. 36 in terms of the shapes of a transparent conductive layer and a metal layer at a back surface side.

(Features which Solar Cells 300 to 302 have in Common)

The first of features which solar cells 300, 301, and 302 shown in FIGS. 35 to 37 respectively have in common is as follows. Since there is employed a method to laminate a photoelectric conversion layer 113a or 113b on a transparent conductive layer 117 at a side where light is incident to cover nanorods 119a or 119b on the transparent conductive layer 117, the photoelectric conversion layer 113a or 113b has, on its back surface opposite to a side where light is incident to the solar cells 300 to 302 out of its front and back surfaces, concavities and convexities corresponding to the shapes of the nanorods 119a or 119b.

The concavities and convexities are formed as if the shapes of the nanorods 119a or 119b were transferred. It should be noted that the concavities and convexities are made of a medium itself of the photoelectric conversion layer 113a or 113b.

The photoelectric conversion layer 113a or 113b has a structure in which semiconductor layers with different polarities are adjacent to each other as shown in FIG. 21 for example. The detail of the structure is not shown in FIGS. 35 to 37.

More strictly defining a corresponding relation between the shapes of the nanorods 119a or 119b and the concavities and convexities on the back surface of the photoelectric conversion layer 113a or 113b, the central axis of each of the nanorods 119a or 119b corresponds to the central axis of each of the concavities made of the medium of the photoelectric conversion layer 113a or 113b in a thickness direction of the photoelectric conversion layer 113a or 113b as indicated by a central line C of (b) of FIG. 35.

This is because the photoelectric conversion layer 113a or 113b is laminated on the transparent conductive layer 117 to cover the nanorods 119a or 119b on the transparent conductive layer 117 as described above. In order that such a method allows formation of concavities and convexities on the back surface of the photoelectric conversion layer 113a or 113b, the height of the nanorods 119a or 119b is set to be smaller than the thickness of the photoelectric conversion layer 113a or 113b. Specifically, it is preferable that the height of the nanorods 119a or 119b is not less than ⅓ and not more than ½ of the thickness of the photoelectric conversion layer 113a or 113b.

Similarly with the positioning of the nanorods 119 shown in FIG. 24, it is preferable that the nanorods 119a or 119b are positioned on corners of a square on a plan view of the photonic conversion layer 113a or 113b seen from a direction normal to the surface thereof, as shown in (a) of FIGS. 35 to 37. That is, it is preferable that a photonic crystal has a structure in which the nanorods 119a or 119b are arranged two-dimensionally and in a square lattice manner.

As already described with reference to FIG. 24, the pitch a for the nanorods 119a or 119b is set to not less than ¼ time and not more than 1 time with respect to the wavelength $\lambda$ of a resonant peak.

The shape of the nanorods 119a or 119b may be a column as shown in (a) of FIG. 35, or may be substantially a truncated cone as shown in (b) of FIGS. 36 and 37. When the shape of the nanorods 119a or 119b is a column, the cross section thereof is rectangular as shown in (b) of FIG. 35. When the shape of the nanorods 119a or 119b is substantially a truncated cone, the cross section thereof is substantially trapezoidal as shown in (b) of FIGS. 36 and 37. In either shape, the edge of the bottom of the column or substantial truncated cone on the back surface of the photoelectric conversion layer 113a or 113b may be sharp or form a smooth curve.

The second of the features which the solar cells 300 to 302 have in common is that the kinds and the order of the laminated layers are the same among the solar cells 300 to 302. That is, the solar cell 300 includes a glass substrate 118, a transparent conductive layer 117 having the nanorods 119a on its back surface, the photoelectric conversion layer 113a, a transparent conductive layer 112a, and a metal electrode layer 111 (metal layer) which are laminated in this order from a side where light is incident. Furthermore, the solar cell 301 includes a glass substrate 118, a transparent conductive layer 117 having the nanorods 119b on its back surface, the photoelectric conversion layer 113b, a transparent conductive layer 112b, and a metal electrode layer 111 (metal layer) which are laminated in this order from a side where light is incident. Furthermore, the solar cell 302 includes a glass substrate 118, a transparent conductive layer 117 having the nanorods 119b on its back surface, the photoelectric conversion layer 113b, a transparent conductive layer 112c, and a metal electrode layer 111c (metal layer) which are laminated in this order from a side where light is incident.

The photoelectric conversion layer 113a is sandwiched by the transparent conductive layers 117 and 112a whose mediums have smaller refractive indices than the refractive index of the medium of the photoelectric conversion layer 113a. The transparent conductive layer 112a is adjacent to the metal electrode layer 111. The photoelectric conversion layer 113b also is sandwiched by the transparent conductive layers 117 and 112a or 112b whose mediums have smaller refractive indices than the refractive index of the medium of the photoelectric conversion layer 113b. The transparent conductive layer 112a or 112b is adjacent to the metal electrode layer 111 or 111c.

(Feature which Solar Cells 300 and 301 have in Common)

Next, a feature which the solar cells 300 and 301 shown in FIGS. 35 and 36 respectively have in common is that at a side of the solar cells 300 and 301 which is opposite to a side where light is incident to the solar cells 300 and 301, i.e. at the outermost layer of the back surface side of the solar cells 300 and 301, there is provided the metal electrode layer 111 for covering the whole back surface side of the solar cells 300 and 301, and the metal electrode layer 111 is a flat layer. What operation and effect are yielded by this configuration will be mentioned later.

(Feature Specific to Solar Cell 302)

A feature specific to the solar cell 302 is the shape of the metal electrode layer 111c. The solar cell 302 is designed such that the photoelectric conversion layer 113b, the transparent conductive layer 112c, and the metal electrode layer 111c are laminated in this order on the transparent conductive layer 117 while maintaining the shape of the nanorods 119b on the back surface of the transparent conductive layer 117. Consequently, in the solar cell 302, at least a front surface of the metal electrode layer 111c (surface closer to the side where light is incident to the solar cell 302) out of the front and back surfaces of the metal electrode layer 111c has concavities and convexities that serve as a photonic crystal structure.

It should be noted that lack of concavities and convexities on the back surface side of the metal electrode layer 111c does not have an influence on power generation efficiency of the solar cell 302. Furthermore, to what degree concavities and convexities corresponding to the shape of the nanorods 119b are formed on the front and back surfaces of the metal electrode layer 111c depends on the thickness of the transparent conductive layer 112c adjacent to the metal electrode layer 111c. This will be mentioned later.

(Operation of Solar Cell)

Light incident to the photoelectric conversion layer 113a (113b) via the glass substrate 118 and the transparent conductive layer 117 generates, mainly at the intrinsic semiconductor layer, electrons and electron holes, and excites the electrons from a valence band to a conduction band, so that the light is absorbed by the intrinsic semiconductor layer. The excited electrons become a current that flows in a circuit consisting of the transparent conductive layer 117, the metal electrode layer 111 (111c), and an external resistor 7a (apparatus, device etc.), thereby generating a photovoltaic power at the external resistor 7a.

The metal electrode layer 111 (111c) may also serve as a reflective plate. The metal electrode layer 111 (111c) can reflect light having been transmitted by the photoelectric conversion layer 113a (113b) without photoelectric conversion, so that the light travels to the photoelectric conversion layer 113a (113b) again. By providing the metal electrode layer 111 (111c) in such a manner as to cover the whole back surface of the solar cell 300 (301 or 302), it is possible to surely reflect light having been transmitted by the photoelectric conversion layer 113a (113b), so that the solar cell 300 (301 or 302) can have a higher light absorption ratio.

The nanorods 119a or 119b are arranged periodically in such a manner that the pitch a is not less than ¼ and not more than 1 with respect to the wavelength λ, thereby serving as a photonic crystal structure. Accordingly, as described in Second Embodiment with reference to FIG. 25, a band edge B which is the extremum of a photonic band of the photonic crystal is provided at the point Γ in such a manner as to correspond to the pitch a.

Using the band edge B, it is possible to cause the photonic crystal to resonate light incident in a vertical direction and with a wavelength of λ which is a resonant peak wavelength, out of light incident to the solar cell 300 (301 or 302). The light with a wavelength of λ resonated in the photoelectric crystal is absorbed by the medium of the photoelectric conversion layer 113a (113b). Therefore, it is possible to increase the light absorption ratio of the solar cell 300 (301 or 302).

In the present embodiment, photonic crystal structures are provided on both surfaces of the photoelectric conversion layer 113a (113b), so that the power generation efficiency of the solar cell 300 (301 or 302) can be increased further. The reason is as follows.

As in the present embodiment, in a case where the central axes of the nanorods 119a or 119b correspond to the central axes of the concavities made of the medium of the photoelectric conversion layer 113a or 113b in a thickness direction of the photoelectric conversion layer 113a or 113b, photonic crystals having the same structure are provided on the front and back surfaces of the photoelectric conversion layer 113a (113b).

Consequently, using the band edge B corresponding to the pitch a of the photonic crystals having the same structure, the photonic crystals on the front and back surfaces of the photoelectric conversion layer 113a (113b) can resonate light with the wavelength λ. Therefore, the effect of optimal light confinement in the medium of the photoelectric conversion layer 113a (113b) can be expected, so that the light absorption ratio of the solar cell can be increased further.

Instead of laminating the photoelectric conversion layer 113a (113b) on the transparent conductive layer 117 to cover the nanorods 119a or 119b on the transparent conductive layer 117, concavities and convexities that serve as a photonic crystal structure may be further formed on the back surface of the photoelectric conversion layer 113a (113b) by the technique of photolithography as described with reference to FIG. 17. In this case, a photonic crystal structure at the front surface of the photoelectric conversion layer 113a (113b) can be different from a photonic crystal structure at the back surface.

Consequently, the wavelength of light to be resonated can differ between the front surface and the back surface of the photoelectric conversion layer 113a (113b). As a result, it is possible to expect the effect of broadening the wavelength band of light absorbed by the photoelectric conversion layer 113a (113b). Accordingly, also in this case, it is possible to increase the power generation efficiency of the solar cell.

As means for moving the light-receiving surface of the solar cell 300 (301 or 302) in accordance with the direction of the sun or as a light converging device, there may be additionally provided the tracking system shown in (a) and (b) of FIG. 19 or the parabolic concentrator 90 shown in FIG. 20. This configuration allows increasing light reception of the solar cell 300 (301 or 302) even when light entering the photonic crystal has angular dependency. This has been already described in Second Embodiment.

(Operation and Effect 1 of Metal Layer)

As described above, in the solar cells 300 and 301 shown in FIGS. 35 and 36, respectively, the metal electrode layer 111 covering the whole back surface side of the solar cells 300 and 301 is a flat layer.

Consequently, the metal electrode layer 111 reflects light having been transmitted by the photoelectric conversion layer 113a (113b) etc. so that the light travels to the photoelectric conversion layer 113a (113b) again, and accordingly the photoelectric conversion ratio can be increased.

Since the metal electrode layer 111 is a flat layer, measurement values indicative of properties of the solar cells 300 and 301 are likely to be in accordance with the results of simulations. Accordingly, it is easy to obtain designed properties as expected.

Furthermore, since the metal electrode layer 111 is a flat layer, the metal electrode layer 111 can have a smaller electric resistance than when the metal electrode layer 111 has concavities and convexities serving as a photonic crystal structure. This is advantageous when taking out a power.

(Operation and Effect 2 of Metal Layer)

On the other hand, as described with reference to FIG. 37, in the solar cell 302, at least the front surface out of the front and back surfaces of the metal electrode layer 111c has concavities and convexities that serve as a photonic crystal structure.

Since at least the front surface of the metal electrode layer 111c which surface contacts the transparent conductive layer 112c also has concavities and convexities that serve as a photonic crystal structure, light with a wavelength out of the target wavelength band is scattered by the metal electrode layer 111c. Furthermore, increase in optical energy can be expected due to (surface) plasmon resonance by the metal layer. Consequently, it is possible to expect further increase in the light absorption ratio of the solar cell 302 by broadening the wavelength band of light absorbed by the photoelectric conversion layer 113b.

(Operation and Effect of Transparent Conductive Layer)

The transparent conductive layer 117 made of a medium whose refractive index is smaller than that of the photoelectric conversion layer 113a (113b) and the transparent conductive layer 112a (112b or 112c) sandwich the photoelectric conversion layer 113a (113b). This configuration allows confining light that would be propagated in a direction normal to the surfaces of the photoelectric conversion layer 113a (113b) and leak therefrom, based on the same principle of optical fibers in which a core with a high refractive index is covered with a clad with a low refractive index. Consequently, it is possible to further increase the light absorption ratio of the photoelectric conversion layer 113a (113b).

The transparent conductive layer 112a (112b or 112c) and the transparent conductive layer 117 are made of a conductive material for the purpose of taking out a current. In a case where the transparent conductive layer 112a (112b or 112c) and the transparent conductive layer 117 are replaced with dielectric layers, the same effect of confining light that would leak can be yielded. However, this case requires an additional configuration for taking out a current from the photoelectric conversion layer 113a (113b) in a lateral direction.

The transparent conductive layer 117 and the transparent conductive layer 112a (112b or 112c) each have a thickness that meets a condition for allowing confinement of light that would be propagated in a direction normal to the surfaces of the photoelectric conversion layer 113a (113b) and leak therefrom. The thickness of the transparent conductive layer 112a (112b or 112c) positioned closer to the back surface of the solar cell 300 (301 or 302) can be selected from thicknesses that are integral multiples of the minimum thickness that meets the above condition. The thickness of the transparent conductive layer 112a (112b or 112c) is preferably larger than the height of the nanorods 119a or 119b.

For example, in a case where the thickness of the transparent conductive layer 112a or 112c is the minimum thickness as shown in (b) of FIG. 35 or (b) of FIG. 37, the concavities and convexities on the back surface of the photoelectric conversion layer 113a (113b) are transferred most strongly on the transparent conductive layer 112a or 112c. Accordingly, when the metal conductive layer 111c is laminated on the transparent conductive layer 112c to cover the transparent conductive layer 112c, the concavities and convexities are transferred to the metal conductive layer 111c, too.

Here, when the metal electrode layer 111 is required to be a flat layer as shown in (b) of FIG. 35, it is necessary to carry out a planarizing process for forming the metal electrode layer 111 flatly. That is, the metal electrode layer 111 is deposited after the process for removing concavities and convexities on the transparent conductive layer 112a and planarizing the transparent conductive layer 112a.

In contrast thereto, in a case where the thickness of the transparent conductive layer 112b is an integral multiple of the minimum thickness as shown in (b) of FIG. 36, the concavities and convexities on the back surface of the photoelectric conversion layer 113b are no longer transferred onto the metal electrode layer 111 depending on how the thickness is set (e.g. 1 μm or more). Consequently, the metal electrode layer 111 can be a flat layer without the process for planarizing the transparent conductive layer 112b.

It should be noted that as the thickness of the transparent conductive layer 112a (112b or 112c) is smaller, the loss of light absorbed by the transparent conductive layer 112a (112b or 112c) can be smaller.

(Example of Process for Manufacturing Solar Cell)

Figure 38:
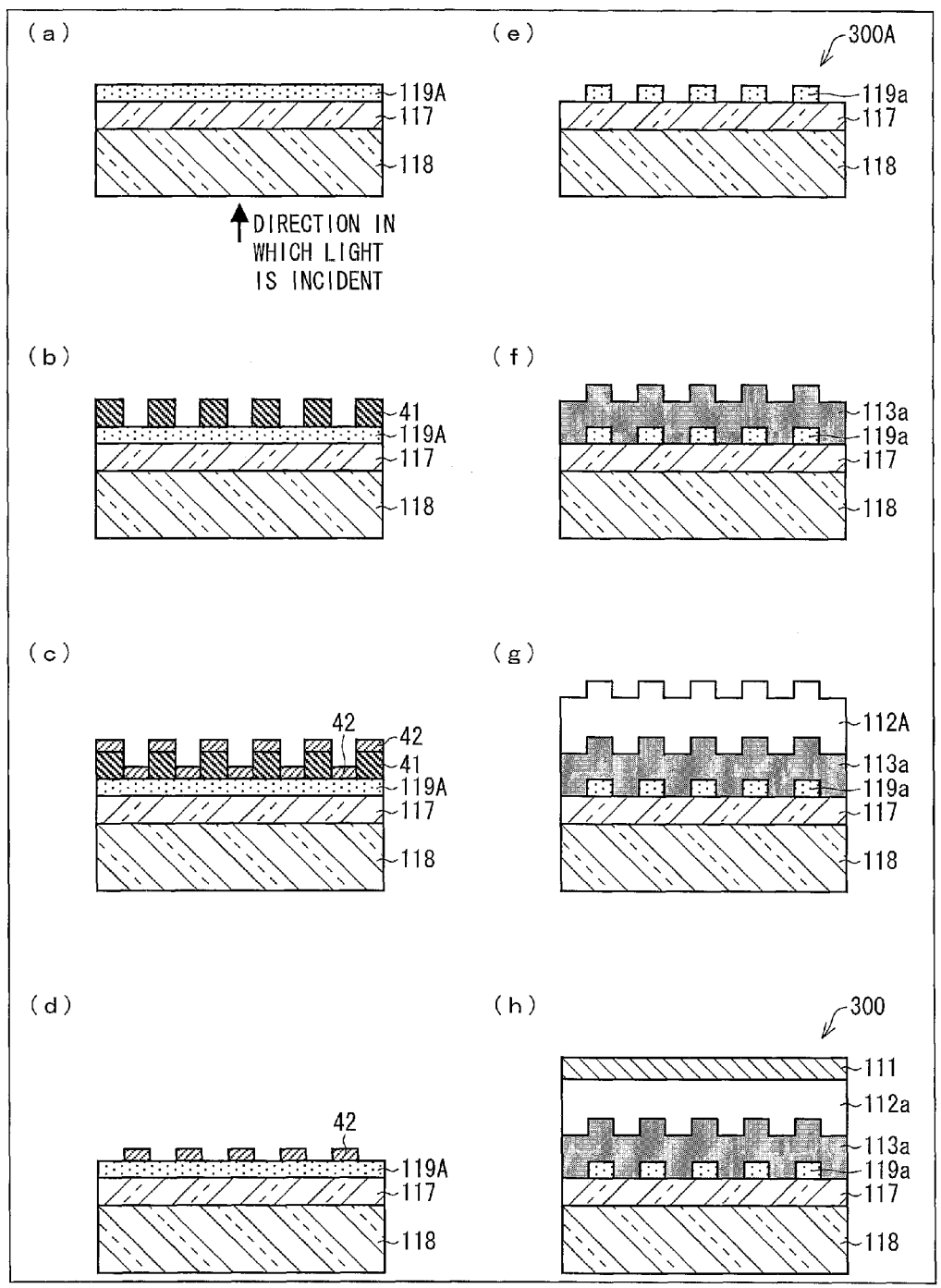
FIG. 38 is a process drawing showing a process for manufacturing the solar cell shown in FIG. 35.

The process for manufacturing the solar cell 300 shown in FIG. 35 is explained below as an example. FIG. 38 is a process drawing showing a process for manufacturing the solar cell 300. Numerals regarding film thickness are merely examples and may be changed appropriately.

Initially, as shown in (a) of FIG. 38, $SnO_2$ is evaporated on the glass substrate 118 to form the transparent conductive layer 117, and then $SiO_2$ as a transparent dielectric material used to form the nanorods 119a is evaporated on the transparent conductive layer 117 to have a thickness of 350 nm so as to provide a $SiO_2$ layer 119A. Instead of evaporation of $SiO_2$, the SOG (Spin-on Glass) solution mentioned in Second Embodiment may be applied by spin coating.

These transparent dielectric materials hardly absorb light. Besides, these transparent dielectric materials have refractive indices smaller than the refractive index of the photoelectric conversion layer 113a (113b). The transparent dielectric material that constitutes the nanorods is preferably selected from transparent materials whose refractive indices are smaller by 0.4 or more than that of the photovoltaic material constituting the photoelectric conversion layer.

Subsequently, as shown in (b) of FIG. 38, a photoresist 41 is applied onto the $SiO_2$ layer 119A (or SOG layer) to have a thickness of 900 nm, and then patterns corresponding to positioning patterns of the nanorods 119a are drawn by electron beam exposure. In a case where the photoresist 41 is a positive photosensitive material, the exposed portion is removed by development. Thus, there are provided the positioning patterns of the nanorods 119a serving as a photonic crystal structure in which the pitch a is set to be ¼ to 1 with respect to the wavelength λ of the resonant peak.

Subsequently, as shown in (c) of FIG. 38, Al is evaporated on the whole of the positioning patterns to have a thickness of 300 nm so as to provide an Al film 42.

Thereafter, as shown in (d) of FIG. 38, the photoresist 41 is removed so that the Al film 42 remains only at the portions where the nanorods 119a are provided.

Furthermore, as shown in (e) of FIG. 38, using the remaining Al film 42 as a mask, the unmasked $SiO_2$ is removed precisely by ICP-RIE (Inductive Coupled Plasma-Reactive Ion Etching) using carbon tetrafluoride ($CF_4$) as an etching gas. Thus, an intermediate 300A where the nanorods 119a are arranged two-dimensionally on the transparent conductive layer 117 is prepared.

Subsequently, the remaining Al film 42 is removed by wet etching using hydrochloric acid (HCl).

Next, as shown in (f) of FIG. 38, a-Si is evaporated on the whole surface of the intermediate 300A and is doped with p-impurity to form a p-a-Si layer, and a-Si is evaporated thereon to form i-a-Si layer, and a-Si is evaporated thereon and is doped with n-impurity to form an n-a-Si layer. Thus, the photoelectric conversion layer 113a of pin type is prepared.

Thereafter, as shown in (g) of FIG. 38, $SnO_2$ is evaporated to have the minimum thickness that meets the above condition, so as to provide a transparent conductive layer 112A. At this stage, the transparent conductive layer 112A has thereon concavities and convexities corresponding to the nanorods 119a.

When a metal layer is evaporated while keeping the concavities and convexities, the metal layer has concavities and convexities, too, so that the solar cell 302 shown in (b) of FIG.

37 is completed. As described above, the solar cell 302 does not require a special process other than the process for providing a photonic crystal, and so can be manufactured easier than the solar cell 300. On the other hand, when the concavities and convexities on the top surface of the transparent conductive layer 112A are planarized by CMP (Chemical Mechanical Polishing) or etching used in preparation of integrated circuits etc. and the metal layer 111 is evaporated thereon as shown in (h) of FIG. 38, the solar cell 300 shown in (b) of FIG. 35 is completed.

(Another Example of Process for Manufacturing Solar Cell)

Figure 39:
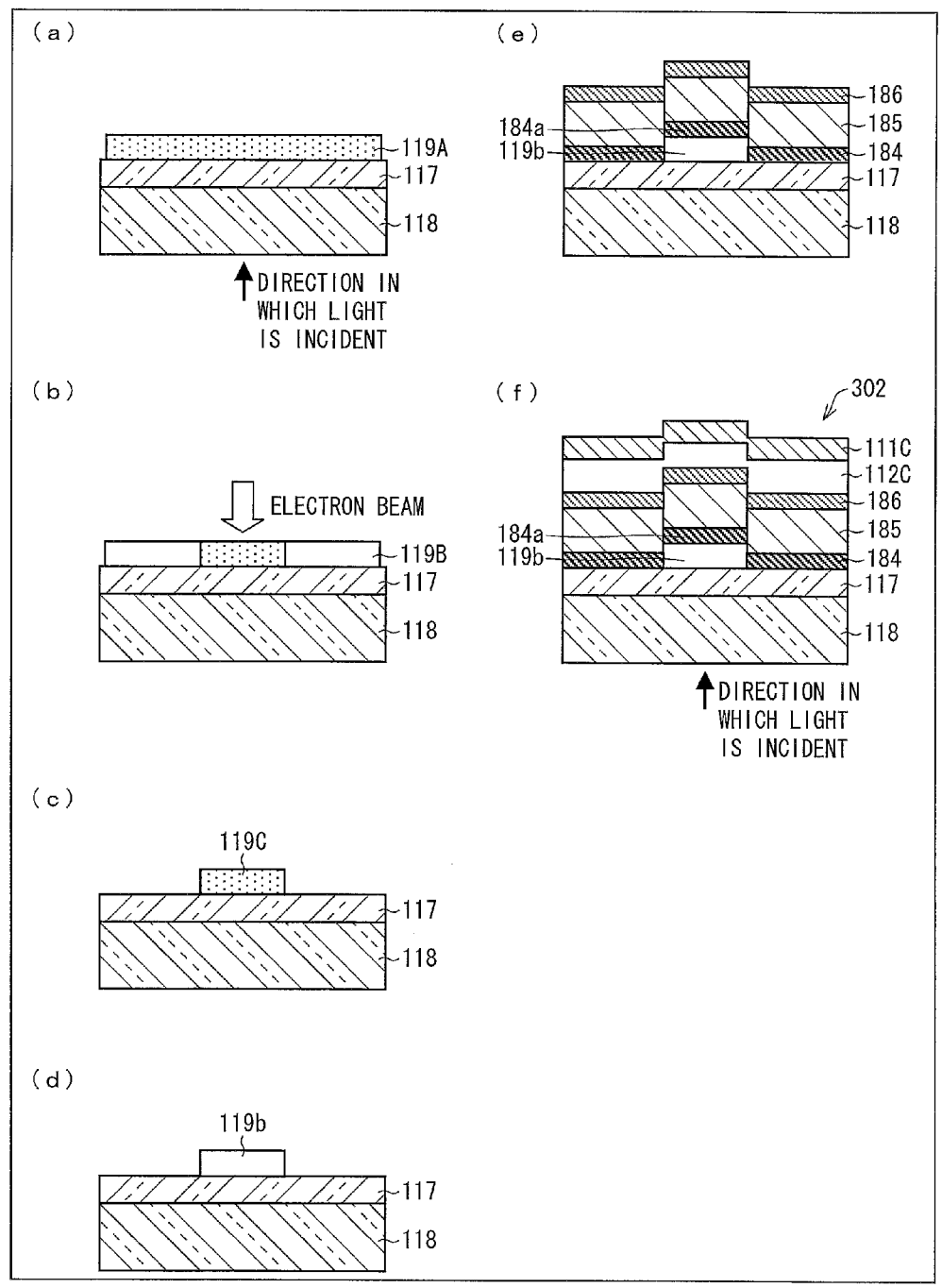
FIG. 39 is a process drawing schematically showing a process for manufacturing the solar cell shown in FIG. 37.

Lastly, another example of the process for manufacturing the solar cell 302 shown in FIG. 37 is explained. FIG. 39 is a process drawing schematically showing a process for manufacturing the solar cell 302. Numerals regarding film thickness etc. are merely examples and can be changed appropriately.

Initially, as shown in (a) of FIG. 39, an SOG solution such as HSQ (Hydrogen Silsesquioxane) is applied by spin coating onto a surface of the transparent conductive layer 117 (surface opposite to a side where light is incident to the solar cell) laminated on and integrated with the glass substrate 118, so as to provide an HSQ layer 119A. The thickness of the HSQ layer 119A is, for example, between 100 nm and 150 nm. HSQ is an inorganic polymer suitable for the application of high resolution electron beam negative resist.

Next, as shown in (b) of FIG. 39, using electron beam lithography, an electron beam is radiated to the HSQ layer 119A so that patterns of the nanorods 119b are drawn on the HSQ layer 119A. As a result, the HSQ layer 119A is changed to an exposed HSQ layer 119B. The exposed HSQ layer 119B has portions exposed and insoluble to a developer, which portions correspond to the patterns of the nanorods 119b.

Subsequently, as shown in (c) of FIG. 39, after a developing process, an insoluble portion 119C remains on the transparent conductive layer 117. The diameter of the insoluble portion 119C is several 100 nm for example.

Next, as shown in (d) of FIG. 39, the insoluble portion 119C is irradiated with oxygen ($O_2$) plasma and annealed, so that HSQ changes to have a $SiO_2$-like structure and the insoluble portion 119C changes to the nanorod 119b.

The process by electron beam lithography from (b) of FIG. 39 to (d) of FIG. 39 may be replaced with a process by nanoimprinting. In the case of nanoimprinting, a mold with cavities corresponding to the nanorods 119b is pressed to the HSQ layer 119A with a high pressure. Thereafter, similarly with the process shown in (d) of FIG. 39, the HSQ layer 119A is irradiated with oxygen ($O_2$) plasma and annealed, so that the nanorods 119b are provided on the transparent conductive layer 117. The diameter of the nanorod 119b is, similarly with above, several 100 nm for example. The arrangement of the nanorods 119b in this case is one shown in FIG. 24.

Subsequently, as shown in (e) of FIG. 39, a p-a-Si layer 184, an i-a-Si layer 185, and an n-a-Si layer 186 are formed as the photoelectric conversion layer 113b (with a thickness of 330 nm for example) shown in FIG. 37. Specifically, a-Si is evaporated on the whole surface of the transparent conductive layer 117 where the nanorods 119b are provided, and is doped with p-impurity to form the p-a-Si layer 184, and a-Si is evaporated thereon to form an i-a-Si layer 185, and a-Si is evaporated thereon and is doped with n-impurity to form an n-a-Si layer 186.

At this stage, the height of the nanorods 119b, i.e. the application thickness of the HSQ layer 119A is determined in order to avoid too much closeness between the p-a-Si film 184a covering the nanorods 119b and the n-a-Si layer 186 surrounding the p-a-Si film 184a from causing leakage (connection).

Lastly, as shown in (f) of FIG. 39, the transparent conductive layer 112c and the metal electrode layer 111c are sequentially laminated on the n-a-Si layer 186, so that the solar cell 302 is completed.

As described above, in the manufacturing methods shown in FIGS. 38 and 39, the a-Si layer is not processed, and therefore it is expected that no damage is made to the a-Si layer. In a case where the SOG material is used for forming the nanorods, it is considered that properties of the solar cell are determined depending on how to handle the SOG material or what state the SOG material is in.

The following additionally explains features of the solar cell of the present invention.

The solar cell in accordance with a second aspect of the present invention is arranged such that the photonic crystal is designed such that columnar mediums whose refraction index is smaller than that of the medium of the photoelectric conversion layer are provided periodically inside the medium of the photoelectric conversion layer in order that the photonic crystal has a photonic band gap, and there are provided defects where the columnar mediums are not provided in order to provide a defect level in the photonic band gap, and when a wavelength of a resonance peak corresponding to the defect level is λ, the columnar mediums are provided two-dimensionally with a pitch of not less than λ/7 and not more than λ/2 with respect to the wavelength λ, and the defects are provided in a matrix manner so as to serve as a resonator as a whole that provides a photonic band gap.

With the arrangement, the photonic crystal having defects so as to provide a defect level in a photonic band gap is provided in the photoelectric conversion layer, so that light with a specific wavelength corresponding to the defect level out of light entering the photoelectric conversion layer is confined inside and in the vicinity of the defects in the photonic crystal and is resonated.

When the columnar mediums (second mediums) are arranged two-dimensionally with a pitch of not less than λ/7 and not more than λ/2 with respect to the wavelength λ of the resonant peak, the coefficient $\kappa_V$ is substantially equal to the absorption coefficient, so that light absorption by the medium of the photoelectric conversion layer is at the maximum or close to the maximum.

The solar cell in accordance with a third aspect of the present invention is arranged such that the photonic crystal is designed such that columnar mediums whose refraction index is smaller than that of the medium of the photoelectric conversion layer are provided periodically inside the medium of the photoelectric conversion layer in order that the photonic crystal has a photonic band edge, and when a wavelength of resonance by the photonic crystal is λ, the columnar mediums are provided two-dimensionally with a pitch of not less than λ/4 and not more than λ, and there is additionally provided (i) means for moving a light-receiving surface of the solar cell in accordance with a motion of the sun or (ii) a light-converging device.

With the arrangement, the photonic crystal is designed such that the columnar mediums are arranged two-dimensionally with a pitch of not less than λ/4 and not more than λ. Accordingly, a band edge is provided at the point Γ in the reciprocal lattice space of the photonic crystal and the wavelength of light defined by the band edge is λ.

Consequently, out of light incident to the photoelectric conversion layer in which the photonic crystal is provided, light incident in a vertical direction and with a wavelength of λ can be confined and resonated in the photoelectric conversion layer. Thus, light with the wavelength λ resonated in the photoelectric conversion layer with angle dependency is absorbed by the medium of the photoelectric conversion layer. This allows increasing the light absorption ratio of the solar cell.

Furthermore, there is additionally provided (i) means for moving the light-receiving surface of the solar cell in accordance with a motion of the sun or (ii) a light-converging device. Accordingly, even when light capable of entering the photonic crystal has angle dependency, it is possible to increase light reception by the solar cell. Consequently, even with the arrangement, it is possible to increase light absorption by the solar cell and to increase a light absorption ratio.

The solar cell in accordance with a fourth aspect of the present invention is arranged such that the photonic crystal is designed such that the columnar mediums each have a height equal to a thickness of the photoelectric conversion layer.

The above arrangement is one example of a configuration of a two-dimensional photonic crystal that can be manufactured relatively easily by a publicly known semiconductor process technique. Furthermore, a two-dimensional photonic crystal with the above arrangement, when provided with defects, can efficiently confine in the defects light entering from the outside of the device.

Furthermore, when the height of the columnar mediums is equal to the thickness of the photoelectric conversion layer, light can enter, without incident angle dependency, the photoelectric conversion layer, in other words, the photonic crystal. Therefore, the above arrangement is suitable for a photoelectric conversion element that is required to have as high a light absorption ratio as possible, such as a solar cell.

The solar cell in accordance with a fifth aspect of the present invention may be arranged such that the photonic crystal is designed such that the columnar mediums each have a height which is not more than ¼ of a thickness of the photoelectric conversion layer.

With the arrangement, the height of the columnar mediums to be formed in the photoelectric conversion layer is smaller than the height of the photoelectric conversion layer, so that it is easy to form the columnar mediums in the photoelectric conversion layer. That is, it is easy to form a photonic crystal.

The solar cell in accordance with a sixth aspect of the present invention is arranged such that the photoelectric conversion layer is interleaved between two layers each made of a medium whose refraction index is smaller than that of the medium of the photoelectric conversion layer, and at least one of the two layers is transparent.

With the arrangement, light that would be propagated in a direction normal to the surfaces of the photoelectric conversion layer and leak therefrom can be confined based on the same principle as that of optical fibers in which a core with a high refractive index is covered with a clad with a low refractive index. Consequently, it is possible to further increase the light absorption ratio of the photoelectric conversion layer.

In order that light enters the photonic crystal, at least one of the two layers which one is closer to the light-receiving surface of the solar cell is preferably transparent.

The solar cell in accordance with a seventh aspect of the present invention is arranged such that the photoelectric conversion layer has an adjacency structure in which a p-semiconductor layer, an intrinsic semiconductor layer, and an n-semiconductor layer are positioned adjacently to each other and the adjacency structure is a vertical structure in which individual layers are laminated vertically.

The solar cell having an adjacency structure in which a p-semiconductor layer, an intrinsic semiconductor layer, and an n-semiconductor layer are positioned adjacently to each other as above is a so-called pin solar cell.

The pin solar cell is suitable for the application of a solar cell because the pin solar cell generates electrons and electron holes at the intrinsic semiconductor layer and can efficiently take out a current. Furthermore, the vertical structure is advantageous for reducing the area occupied by the solar cell.

The solar cell in accordance with an eighth aspect of the present invention is arranged such that an outermost layer at a side of the solar cell which side is opposite to a side where light is incident to the solar cell is a metal layer covering a whole of the opposite side.

With the arrangement, the metal layer reflects light having been transmitted by the photoelectric conversion layer etc. so that the light travels to the photoelectric conversion layer again. This increases the photoelectric conversion ratio. Furthermore, the metal layer can serve as an electrode via which a current is taken out.

In the present invention, the photonic crystal is not necessarily required to be formed throughout the photoelectric conversion layer. Formation of the photonic crystal at a part of the photoelectric conversion layer allows increasing the photoelectric conversion ratio than a conventional technique. In this case, the metal layer is preferably provided at the whole of a lower region corresponding to the part where the photonic crystal is provided.

The solar cell in accordance with a ninth aspect of the present invention is arranged such that the columnar mediums are positioned at corners and a center of each of a plurality of hexagons consisting of triangular lattices on a plan view, and when the plurality of hexagons are referred to as first units and the pitch for the columnar mediums is a, the first units are provided two dimensionally with a pitch of 2a in an x-direction and √3a in a y-direction, and the defects are provided in a rectangular lattice manner with a pitch of 4a to 8a in an x-direction and 2√3a to 4√3a in a y-direction.

With the arrangement, the $\kappa_V$ and α (or $Q_V$ and $Q_\alpha$) are substantially equal to each other, so that light absorption by the medium of the photoelectric conversion layer can be at maximum and the wavelength band of the absorbed light can be broadened at maximum. The assembly of the defects and nanorods surrounding the defects can be considered as resonators that confine light. By arranging a plurality of resonators in a matrix manner, it is possible to cause the resonators to resonate with each other, thereby making the intensity of the whole resonance smaller (making $Q_V$ smaller=making $\kappa_V$ larger). This intensifies coupling between the photonic crystal and the outside, making it easier to take light in the photonic crystal. On the other hand, since the Q value of the photonic crystal is made smaller, light absorption by the photoelectric conversion layer is larger, and the wavelength band of the absorbed light can be broader.

The solar cell may be arranged such that the columnar mediums are positioned at corners and a center of each of a plurality of hexagons consisting of triangular lattices and the defects are provided in the number of at least two in the plurality of hexagons on a plan view, and when the hexagons having the at least two defects are referred to as second units and the pitch for the columnar mediums is a, the second units are provided two-dimensionally with a pitch of not less than 4a in an x-direction and √3a in a y-direction, and the defects are provided in a square lattice manner with a pitch of 4a to 8a in an x-direction and 2√3a to 4√3a in a y-direction.

Also in this case, the $\kappa_V$ and α (or $Q_V$ and $Q_\alpha$) are substantially equal to each other, so that the same effect as above can be yielded.

Furthermore, by providing at least two defects in the units in which the columnar mediums are positioned on the corners of a hexagon, degeneracy of a resonance peak is split and a plurality of resonant peaks with different wavelengths appear. Consequently, the wavelength band of the absorbed light is broadened, too.

The solar cell in accordance with an eleventh aspect of the present invention is arranged such that among the columnar mediums surrounding the defects, two columnar mediums positioned on a line extending in a specific direction are shifted oppositely to each other from the corners of the hexagon in the specific direction so that a distance between the two columnar mediums are shorter.

With the arrangement, periodic arrangement of the columnar mediums is disarranged, so that degeneracy of a resonance peak is split and a plurality of resonant peaks with different wavelengths appear. Consequently, the wavelength band of the absorbed light is broadened, so that the light absorption ratio of the solar cell is increased.

The solar cell in accordance with a twelfth aspect of the present invention is obtained by arranging the solar cell in accordance with the third aspect of the present invention such that the photonic crystal is designed such that the columnar mediums are provided at corners of a triangle on a plan view. Alternatively, the solar cell in accordance with a thirteenth aspect of the present invention is preferably arranged such that the photonic crystal is designed such that the columnar mediums are provided at corners of a rectangle on a plan view.

This provides a photonic crystal in which a band edge is provided at a point $\Gamma$ in a reciprocal lattice space of the photonic crystal, and the wavelength of light defined by the band edge is $\lambda$. Accordingly, by causing light with the wavelength $\lambda$ to resonate inside the solar cell, it is possible to increase the light absorption ratio.

The configurations of the solar cells in accordance with the twelfth and thirteenth aspects of the present invention may be combined with any one of the configurations of the solar cells in accordance with the fourth to eighth aspects of the present invention.

The solar cell in accordance with a fourteenth aspect of the present invention is preferably obtained by arranging the solar cell in accordance with the third, twelfth, or thirteenth aspect of the present invention such that the photonic crystal is designed such that in one region, the columnar mediums are provided two-dimensionally with a constant pitch, and in the other region, the columnar mediums are provided two-dimensionally with another constant pitch.

By changing the constant pitch for the columnar mediums with respect to each region as above, the resonant peak wavelength defined by the band edge of the photonic crystal can differ with respect to each region. Consequently, a plurality of resonant peak wavelengths provided by the photonic crystal can appear with respect to each region, so that the light absorption ratio can be increased further.

The configuration of the solar cell in accordance with the fourteenth aspect of the present invention may be combined with any one of the configurations of the solar cells in accordance with the fourth to eighth aspects of the present invention.

The solar cell in accordance with a fifteenth aspect of the present invention may be obtained by arranging the solar cell in accordance with the thirteenth aspect of the present invention to further include the arrangement that the columnar mediums each have a height smaller than a thickness of the photoelectric conversion layer, and a back surface of the photoelectric conversion layer which is positioned oppositely to a side of the photoelectric conversion layer where light is incident has concavities and convexities made of the medium of the photoelectric conversion layer, the concavities and convexities serving as a photonic crystal structure.

Consequently, in a first photonic crystal in which columnar mediums are periodically arranged at the front surface side of the photoelectric conversion layer, the band edge is provided in such a manner as to correspond to the pitch for the first photonic crystal. Out of light incident to the photoelectric conversion layer, light incident in a vertical direction and with a specific wavelength defined by the band edge is resonated, and absorbed by the medium of the photoelectric conversion layer.

Furthermore, in a second photonic crystal constituted by the concavities and convexities on the back surface (surface opposite to the front surface) of the photoelectric conversion layer, the band edge is provided in such a manner as to correspond to the pitch for the second photonic crystal. Out of light incident to the photoelectric conversion layer, light incident in a vertical direction and with a specific wavelength defined by the band edge corresponding to the pitch for the second photonic crystal is resonated, and absorbed by the medium of the photoelectric conversion layer.

In a case where the pitch for the first photonic crystal and the pitch for the second photonic crystal are identical, it is expected that light with the same wavelength is resonated both in the first photonic crystal and the second photonic crystal to yield the effect of optimal confinement of light.

In a case where the pitch for the first photonic crystal and the pitch for the second photonic crystal are different, it is expected that light with different wavelengths is resonated in the first photonic crystal and the second photonic crystal, respectively, thereby broadening the wavelength band of light absorbed by the medium of the photoelectric conversion layer.

In either case, it is possible to further increase the power generation efficiency of the solar cell.

There is additionally provided (i) means for moving the light-receiving surface of the solar cell in accordance with a motion of the sun or (ii) a light-converging device. Accordingly, even when light capable of entering the photonic crystal has angle dependency, it is possible to increase light reception by the solar cell. This is applicable to the solar cell in accordance with the fifteenth aspect of the present invention as well as to the solar cell in accordance with the third aspect of the present invention.

Furthermore, the configuration of the solar cell in accordance with the fifteenth aspect of the present invention may be combined with any one of the configurations of the solar cells in accordance with the fifth to eighth aspects of the present invention.

The solar cell in accordance with a sixteenth aspect of the present invention may be obtained by arranging the solar cell in accordance with the fifteenth aspect of the present invention such that central axes of the columnar mediums correspond to, in a thickness direction of the photoelectric conversion layer, central axes of the convexities made of the medium of the photoelectric conversion layer.

With the arrangement, there exist photonic crystals having the same structure on the front and back surfaces, respectively, of the photoelectric conversion layer, so that the effect of optimal confinement of light in the medium of the photoelectric conversion layer can be expected. Accordingly, it is possible to further increase the light absorption ratio of the solar cell.

In a case where the central axes of the columnar mediums do not correspond to, in a thickness direction of the photoelectric conversion layer, the central axes of the convexities made of the medium of the photoelectric conversion layer, there exist two kinds of photonic crystals with different structures in the photoelectric conversion layer. In this case, the individual photonic crystals can resonate light with different wavelengths. Consequently, it can be expected that the wavelength band of light absorbed by the photoelectric conversion layer is broadened, so that the power generation efficiency of the solar cell can be increased.

The solar cell in accordance with a seventeenth aspect of the present invention may be obtained by arranging the solar cell in accordance with the fifteenth aspect of the present invention such that an outermost layer at a side of the solar cell which side is opposite to a side where light is incident to the solar cell is a metal layer covering a whole of the opposite side, and the metal layer is a flat layer.

With the arrangement, the metal layer reflects light having been transmitted by the photoelectric conversion layer etc. so that the light travels to the photoelectric conversion layer again. This can increase the photoelectric conversion ratio. Furthermore, the metal layer can serve as an electrode via which a current is taken out.

Since the metal layer is a flat layer, measurement values indicative of properties of the solar cell are likely to be in accordance with the results of simulations. Accordingly, it is easy to obtain designed properties as expected.

Furthermore, since the metal layer is a flat layer, the metal layer can have a smaller electric resistance than when the metal layer has concavities and convexities serving as a photonic crystal structure. This is advantageous when taking out a power.

In the present invention, the photonic crystal is not necessarily required to be formed throughout the photoelectric conversion layer. Formation of the photonic crystal at a part of the photoelectric conversion layer allows increasing the photoelectric conversion ratio than a conventional technique. In this case, the metal layer is preferably provided at the whole of a lower region corresponding to the part where the photonic crystal is provided.

The solar cell in accordance with an eighteenth aspect of the present invention may be obtained by arranging the solar cell in accordance with the fifteenth aspect of the present invention such that an outermost layer at a side of the solar cell which side is opposite to a side where light is incident to the solar cell is a metal layer covering a whole of the opposite side, and at least a front surface of the metal layer which surface is closer to the side where light is incident to the solar cell has concavities and convexities that serve as a photonic crystal structure.

With the arrangement, at least the front surface of the metal layer has concavities and convexities that serve as a photonic crystal structure, and accordingly it is considered that light with a wavelength out of the target wavelength band is scattered by the metal layer. Furthermore, increase in optical energy can be expected due to (surface) plasmon resonance by the metal layer. Consequently, it is possible to expect further increase in the light absorption ratio of the solar cell by broadening the wavelength band of light absorbed by the photoelectric conversion layer.

The solar cell in accordance with a nineteenth aspect of the present invention is preferably obtained by arranging the solar cell in accordance with the seventeenth or the eighteenth aspect of the present invention such that the photoelectric conversion layer is interlaced between two transparent layers each made of a medium whose refraction index is smaller than that of the medium of the photoelectric conversion layer, and one of the two transparent layers which is positioned oppositely to the side where light is incident to the solar cell is adjacent to the metal layer.

With the arrangement, light that would be propagated in a direction normal to the surfaces of the photoelectric conversion layer and leak therefrom can be confined based on the same principle as that of optical fibers in which a core with a high refractive index is covered with a clad with a low refractive index. Consequently, it is possible to further increase the light absorption ratio of the photoelectric conversion layer.

The two transparent layers each have a thickness that meets a condition for allowing confinement of light that would be propagated in a direction normal to the surfaces of the photoelectric conversion layer and leak therefrom. The thickness of the transparent layer positioned oppositely to the side where light is incident to the solar cell, i.e. the transparent layer at the back surface side can be selected from thicknesses that are integral multiples of the minimum thickness that meets the above condition.

In a case where the thickness of the transparent layer at the back surface side is the minimum thickness, the concavities and convexities on the back surface of the photoelectric conversion layer are transferred to the transparent layer at the back surface side and the metal layer. In this case, when the metal layer is required to be a flat layer, it is necessary to carry out a planarizing process for forming the metal layer flatly.

In contrast thereto, in a case where the thickness of the transparent layer at the back surface side is an integral multiple of the minimum thickness, the concavities and convexities on the back surface of the photoelectric conversion layer are not transferred onto the metal layer depending on how the thickness is set. If this is the case, the metal layer can be a flat layer without the planarizing process.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

The present invention is applicable to various kinds of solar cells.

REFERENCE SIGNS LIST 1, 60 Solar cell
2 Photoelectric conversion layer
3, 72 Transparent conductive layer (one of two layers)
4, 74 Transparent conductive layer (the other of two layers)
6, 111, 111c Metal electrode layer (metal layer)
Intrinsic semiconductor layer
21 p-semiconductor layer
22 n-semiconductor layer
30, 76, 76a-76d Nanorods (columnar mediums)
31, 77 Defect
78 Defect region
c Defect level
g Photonic band gap
p Pitch
x Direction (specific direction)
110, 130, 170 Solar cell
111, 171 Back surface metal electrode (metal layer)
112 Transparent conductive layer (one of two layers)
117 Transparent conductive layer (the other of two layers)

113, 173 Semiconductor layer (photoelectric conversion layer)
114, 174 n-semiconductor
115, 175 i-semiconductor
116, 176 p-semiconductor
118 Glass
119, 179 Nanorods (columnar mediums)
121, 123, 127 Photonic crystal
111c Metal electrode layer (metal layer)
112a, 112b, 112c Transparent conductive layer
113a, 113b Photoelectric conversion layer
117 Transparent conductive layer
119a, 119b Nanorods (columnar mediums)
300, 301, 302 Solar cell
a, $a_1$, $a_2$, $a_3$ pitch
$A_1$, $A_2$, $A_3$ region

The invention claimed is:

1. A solar cell, comprising:
a photoelectric conversion layer; and
a photonic crystal inside the photoelectric conversion layer,
a relation $0.26\ Q_V \leq Q_\alpha \leq 0.96\ Q_V$ being met,
wherein $Q_V$ is a Q value representing a magnitude of a resonance effect yielded by coupling between the photonic crystal and an outside and is proportional to an inverse number of a coefficient $\kappa_V$ indicative of strength of coupling between the photonic crystal and the outside, and $Q_\alpha$ is a Q value representing a magnitude of a resonance effect yielded by a medium of the photoelectric conversion layer and is proportional to an inverse number of a coefficient of absorption of light by the medium of the photoelectric conversion layer,
wherein the photonic crystal is configured such that columnar mediums whose refraction index is smaller than that of the medium of the photoelectric conversion layer are provided periodically inside the medium of the photoelectric conversion layer in order that the photonic crystal has a photonic band gap, and there are provided defects where the columnar mediums are not provided in order to provide a defect level in the photonic band gap, and
wherein when a wavelength of a resonance peak corresponding to the defect level is λ, the columnar mediums are provided two-dimensionally with a pitch of not less than λ/7 and not more than λ/2 with respect to the wavelength λ, and the defects are provided in a matrix manner so as to serve as a resonator as a whole that provides a photonic band gap.

2. The solar cell as set forth in claim 1, wherein the photonic crystal is configured such that the columnar mediums each have a height equal to a thickness of the photoelectric conversion layer.

3. The solar cell as set forth in claim 1, wherein the photonic crystal is configured such that the columnar mediums each have a height which is not more than ¼ of a thickness of the photoelectric conversion layer.

4. The solar cell as set forth in claim 1, wherein the photoelectric conversion layer is interleaved between two layers each consisting of a medium whose refraction index is smaller than that of the medium of the photoelectric conversion layer, and at least one of the two layers is transparent.

5. The solar cell as set forth in claim 1, wherein the photoelectric conversion layer has an adjacency structure in which a p-semiconductor layer, an intrinsic semiconductor layer, and an n-semiconductor layer are positioned adjacently to each other and the adjacency structure is a vertical structure in which individual layers are laminated vertically.

6. The solar cell as set forth in claim 1, wherein an outermost layer at a side of the solar cell which side is opposite to a side where light is incident to the solar cell is a metal layer covering a whole of the opposite side.

7. The solar cell as set forth in claim 1, wherein
the columnar mediums are positioned at corners and a center of each of a plurality of hexagons consisting of triangular lattices on a plan view, and
when the plurality of hexagons are referred to as first units and the pitch for the columnar mediums is a,
the first units are provided two-dimensionally with a pitch of 2a in an x-direction and √3a in a y-direction, and
the defects are provided in a square lattice manner with a pitch of 4a to 8a in an x-direction and 2√3a to 4√3a in a y-direction.

8. The solar cell as set forth in claim 1, wherein
the columnar mediums are positioned at corners and a center of each of a plurality of hexagons consisting of triangular lattices and the defects are provided in the number of at least two in the plurality of hexagons on a plan view, and
when the hexagons having the at least two defects are referred to as second units and the pitch for the columnar mediums is a,
the second units are provided two-dimensionally with a pitch of not less than 4a in an x-direction and √3a in a y-direction, and
the defects are provided in a rectangular lattice manner with a pitch of 4a to 8a in an x-direction and 2√3a to 4√3a in a y-direction.

9. The solar cell as set forth in claim 1, wherein among the columnar mediums surrounding the defects, two columnar mediums positioned on a line extending in a specific direction are shifted oppositely to each other from the corners of the hexagon in the specific direction so that a distance between the two columnar mediums are shorter.

10. A solar cell panel, comprising a plurality of units provided one-dimensionally or two-dimensionally, each of the plurality of units being a solar cell as set forth in claim 1.

11. A device, comprising a solar cell as set forth in claim 1, the solar cell serving as a power source.

12. A device, comprising a solar cell panel as set forth in claim 10, the solar cell panel serving as a power source.

13. A solar cell, comprising:
a photoelectric conversion layer; and
a photonic crystal inside the photoelectric conversion layer,
a relation $0.26\ Q_V \leq Q_\alpha \leq 0.96\ Q_V$ being met,
wherein $Q_V$ is a Q value representing a magnitude of a resonance effect yielded by coupling between the photonic crystal and an outside and is proportional to an inverse number of a coefficient $\kappa_V$ indicative of strength of coupling between the photonic crystal and the outside, and $Q_\alpha$ is a Q value representing a magnitude of a resonance effect yielded by a medium of the photoelectric conversion layer and is proportional to an inverse number of a coefficient of absorption of light by the medium of the photoelectric conversion layer,
the photonic crystal is configured such that columnar mediums whose refraction index is smaller than that of the medium of the photoelectric conversion layer are provided periodically inside the medium of the photoelectric conversion layer in order that the photonic crystal has a photonic band edge, when a wavelength of resonance by the photonic crystal is λ, the columnar mediums are provided two-dimensionally with a pitch of not less than λ/4 and not more than λ, there is additionally provided (i) means for moving a light-receiving surface of the solar cell in accordance with a motion of the sun or (ii) a light-converging device, the photonic crystal is configured such that the columnar mediums are provided at corners of a rectangle on a plan view, the columnar mediums each have a height smaller than a thickness of the photoelectric conversion layer, a back surface of the photoelectric conversion layer which is positioned oppositely to a side of the photoelectric conversion layer where light is incident has concavities and convexities made of the medium of the photoelectric conversion layer, the concavities and convexities serving as a photonic crystal structure, and central axes of the columnar mediums correspond to, in a thickness direction of the photoelectric conversion layer, central axes of the convexities made of the medium of the photoelectric conversion layer.

14. The solar cell as set forth in claim 13, wherein an outermost layer at a side of the solar cell which side is opposite to a side where light is incident to the solar cell is a metal layer covering a whole of the opposite side, and the metal layer is a flat layer.

15. The solar cell as set forth in claim 13, wherein an outermost layer at a side of the solar cell which side is opposite to a side where light is incident to the solar cell is a metal layer covering a whole of the opposite side, and at least a front surface of the metal layer which surface is closer to the side where light is incident to the solar cell has concavities and convexities that serve as a photonic crystal structure.

16. The solar cell as set forth in claim 13, wherein the photoelectric conversion layer is interlaced between two transparent layers each consisting of a medium whose refraction index is smaller than that of the medium of the photoelectric conversion layer, and one of the two transparent layers which is positioned oppositely to the side where light is incident to the solar cell is adjacent to the metal layer.

17. The solar cell as set forth in claim 13, wherein the photoelectric conversion layer is interleaved between two layers each consisting of a medium whose refraction index is smaller than that of the medium of the photoelectric conversion layer, and at least one of the two layers is transparent.

18. The solar cell as set forth in claim 13, wherein the photoelectric conversion layer has an adjacency structure in which a p-semiconductor layer, an intrinsic semiconductor layer, and an n-semiconductor layer are positioned adjacently to each other and the adjacency structure is a vertical structure in which individual layers are laminated vertically.

19. The solar cell as set forth in claim 13, wherein an outermost layer at a side of the solar cell which side is opposite to a side where light is incident to the solar cell is a metal layer covering a whole of the opposite side.

* * * * *